US012769650B2

(12) United States Patent
Nakasone

(10) Patent No.: US 12,769,650 B2
(45) Date of Patent: Oct. 20, 2026

(54) MEMORY DEVICE AND MEMORY SYSTEM

(71) Applicant: Kioxia Corporation, Tokyo (JP)

(72) Inventor: Osamu Nakasone, Zushi Kanagawa (JP)

(73) Assignee: Kioxia Corporation, Tokyo (JP)

( * ) Notice: Subject to any disclaimer, the term of this patent is extended or adjusted under 35 U.S.C. 154(b) by 110 days.

(21) Appl. No.: 18/981,086

(22) Filed: Dec. 13, 2024

(65) Prior Publication Data

US 2025/0298742 A1 Sep. 25, 2025

(30) Foreign Application Priority Data

Mar. 19, 2024 (JP) ................................ 2024-043929

(51) Int. Cl.
*G11C 16/08* (2006.01)
*G06F 12/02* (2006.01)

(52) U.S. Cl.
CPC .......... *G06F 12/0246* (2013.01); *G11C 16/08* (2013.01)

(58) Field of Classification Search
CPC ...................................................... G11C 16/08
See application file for complete search history.

(56) References Cited

U.S. PATENT DOCUMENTS

2018/0294036 A1 10/2018 Oh et al.
2020/0090762 A1 3/2020 Shirakawa et al.
2020/0090763 A1 3/2020 Tokutomi et al.
2020/0409788 A1 12/2020 Kurose et al.
2023/0042955 A1 2/2023 You et al.
2023/0307058 A1 * 9/2023 Ganesh Rao .......... G11C 16/08

FOREIGN PATENT DOCUMENTS

TW 202322122 A 6/2023

* cited by examiner

*Primary Examiner* — Jason Lappas
(74) *Attorney, Agent, or Firm* — Foley & Lardner LLP

(57) ABSTRACT

A memory device according to one embodiment includes a plurality of memory cells, a word line, and a controller. Each of the memory cells is configured to store multiple-bit data according to which of a plurality of states having different threshold voltages each of the memory cells is included in. The word line is connected to the memory cells. The controller is configured to count a number of memory cells having threshold voltages on a higher state side among the states, and to execute a read operation for the memory cells as a target, by using a read voltage that is shifted based on a result of the counting.

20 Claims, 19 Drawing Sheets

4bit/cell: 3-4-4-4 coding

| Page | Data | | | | | | | | | | | | | | | |
|---|---|---|---|---|---|---|---|---|---|---|---|---|---|---|---|---|
| | S0 | S1 | S2 | S3 | S4 | S5 | S6 | S7 | S8 | S9 | S10 | S11 | S12 | S13 | S14 | S15 |
| Top | 1 | 0 | 0 | 1 | 1 | 1 | 1 | 0 | 0 | 0 | 0 | 0 | 0 | 1 | 1 | 1 |
| Upper | 1 | 1 | 0 | 0 | 0 | 0 | 0 | 0 | 1 | 1 | 0 | 0 | 1 | 1 | 1 | 1 |
| Middle | 1 | 1 | 1 | 1 | 0 | 0 | 1 | 1 | 1 | 0 | 0 | 0 | 0 | 0 | 0 | 1 |
| Lower | 1 | 1 | 1 | 1 | 1 | 0 | 0 | 0 | 0 | 0 | 0 | 1 | 1 | 1 | 0 | 0 |

| | Data | | |
|---|---|---|---|
| RL1 read | 1 | 0 | 0 |
| RL2 read | 1 | 1 | 0 |
| XOR operation result | 0 | 1 | 0 |

| Table number NTBL | Lower page | | | Middle page | | | | Upper page | | | | Top page | | | |
|---|---|---|---|---|---|---|---|---|---|---|---|---|---|---|---|
| | R5 | R11 | R14 | R4 | R6 | R9 | R15 | R2 | R8 | R10 | R12 | R1 | R3 | R7 | R13 |
| 1 | 0 | −4 | −7 | −1 | −2 | −4 | −9 | 0 | −3 | −5 | −6 | −5 | 0 | −3 | −4 |
| 2 | −2 | −6 | −10 | −2 | −3 | −5 | −12 | 0 | −4 | −7 | −8 | −5 | −1 | −4 | −7 |
| 3 | −3 | −8 | −12 | −3 | −5 | −7 | −15 | 0 | −6 | −9 | −10 | −5 | −2 | −5 | −9 |
| 4 | −4 | −10 | −15 | −4 | −6 | −9 | −18 | −1 | −8 | −11 | −13 | −6 | −3 | −7 | −11 |
| 5 | −5 | −12 | −17 | −5 | −7 | −11 | −21 | −1 | −9 | −13 | −15 | −6 | −4 | −8 | −14 |
| 6 | −6 | −14 | −20 | −6 | −9 | −12 | −24 | −2 | −11 | −14 | −17 | −6 | −5 | −9 | −16 |

FIG. 16

| Magnitude of count value NC | Table number NTBL |
|---|---|
| NC<28 | 0 |
| 28≦NC<66 | 1 |
| 66≦NC<104 | 2 |
| 104≦NC<142 | 3 |
| 142≦NC<180 | 4 |
| 180≦NC<218 | 5 |
| 218≦NC | 6 |

FIG. 17

MEMORY DEVICE AND MEMORY SYSTEM

CROSS-REFERENCE TO RELATED APPLICATIONS

This application is based upon and claims the benefit of priority from prior Japanese Patent Application No. 2024-043929, filed Mar. 19, 2024, the entire contents of which are incorporated herein by reference.

FIELD

Embodiments described herein relate generally to a memory device and a memory system.

BACKGROUND

A NAND flash memory capable of storing data in a nonvolatile manner is known.

BRIEF DESCRIPTION OF THE DRAWINGS

FIG. 16 is a diagram illustrating a specific example of a shift value table used in the on-chip tracking of the memory device according to the first embodiment.

FIG. 17 is a diagram illustrating a specific example of a lookup table used in the on-chip tracking of the memory device according to the first embodiment.

DETAILED DESCRIPTION

Figure 1:
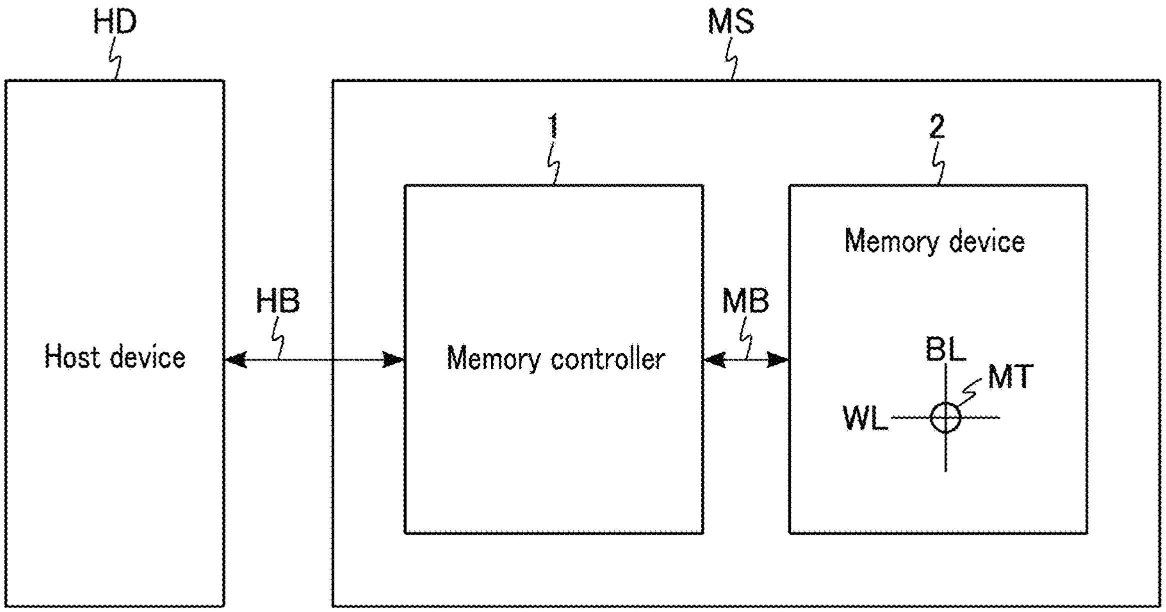
FIG. 1 is a block diagram illustrating an example of a configuration of a memory system according to a first embodiment.

In general, according to one embodiment, a memory device comprising: a plurality of memory cells, a word line, and a controller. Each of the memory cells is configured to store multiple-bit data according to which of a plurality of states having different threshold voltages each of the memory cells is included in. The word line is connected to the memory cells. The controller is configured to count a number of memory cells having threshold voltages on a higher state side among the states, and to execute a read operation for the memory cells as a target, by using a read voltage that is shifted based on a result of the counting.

Hereinafter, embodiments will be described with reference to the accompanying drawings. The embodiments will exemplify apparatuses and methods for embodying the technical idea of the invention. The drawings are schematic or conceptual. The illustration of the configuration is omitted as appropriate. Components having substantially the same functions and configurations are denoted by the same reference numerals. Numbers and the like added to reference numerals are referred to by the same reference numerals and are used to distinguish between similar components.

<1> First Embodiment

A first embodiment relates to a memory system MS configured to determine an optimal shift value of a read voltage in an on-chip manner, based on the number of memory cells in a predetermined range. Hereinafter, details of the memory system MS according to the first embodiment will be described.

<1-1> Configuration

First, a configuration of the memory system MS according to the first embodiment will be described.

<1-1-1> Configuration of Memory System MS

FIG. 1 is a block diagram illustrating an example of a configuration of the memory system MS according to the first embodiment. As illustrated in FIG. 1, the memory system MS can be coupled to an external host device HD (also referred to as a host). The host device HD is an electronic device, such as a personal computer, a personal digital assistant, or a server. The memory system MS is a storage device, such as a memory card or a solid state drive (SSD). The memory system MS includes, for example, a memory controller 1 and at least one memory device 2.

The memory controller 1 is, for example, a semiconductor integrated circuit configured as a system-on-a-chip (SoC), an application specific integrated circuit (ASIC), or a field-programmable gate array (FPGA). The memory controller 1 has a function of managing and controlling the memory device 2. The memory controller 1 is configured to be coupled to the host device HD via a host bus HB. The memory controller 1 is coupled to the memory device 2 via a memory bus MB. The memory controller 1 can control the memory device 2, based on an instruction received from the host device HD. For example, the memory controller 1 can control the memory device 2 to execute a read operation, a write operation, an erase operation, and the like.

The memory device 2 is a semiconductor memory device configured to store data in a nonvolatile manner. The memory device 2 is, for example, a NAND flash memory. In the NAND flash memory, a unit of a data read operation and a data write operation is referred to as a page. The memory device 2 includes a plurality of memory cell transistors MT, a plurality of bit lines BL, and a plurality of word lines WL. For example, each memory cell transistor MT is associated with one bit line BL and one word line WL. A column address is assigned to each of the bit lines BL. A page address is assigned to each of the word lines WL.

<1-1-2> Hardware Configuration of Memory Controller 1

Figure 2:
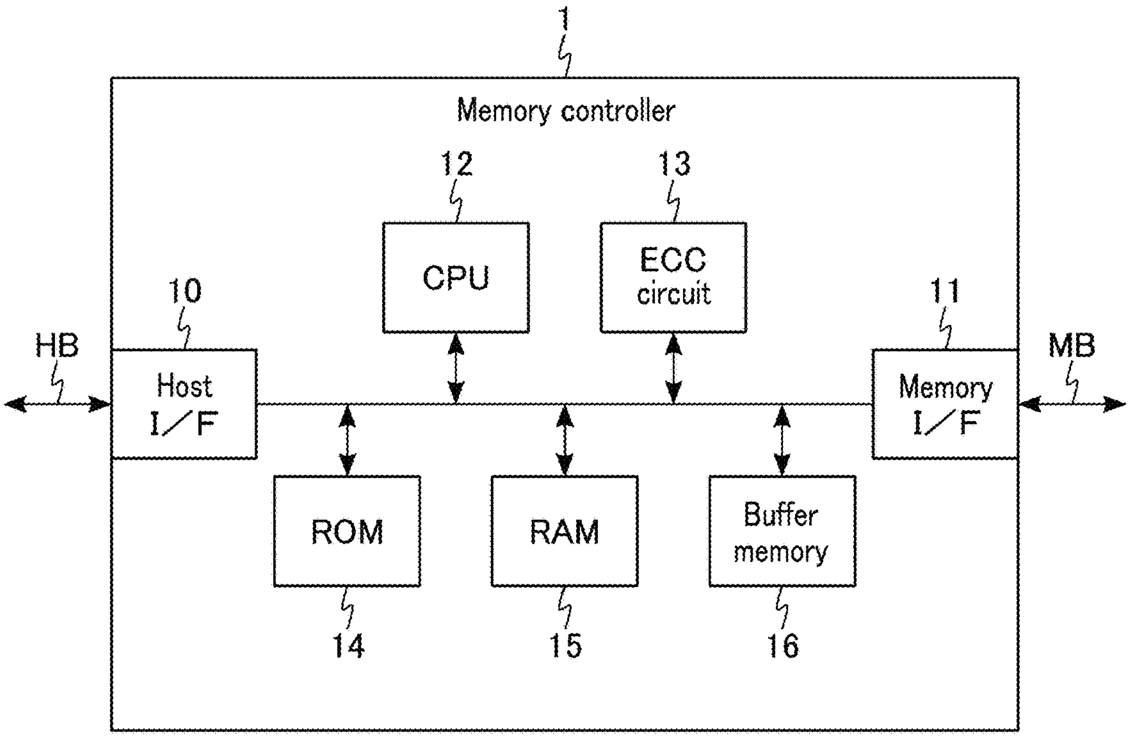
FIG. 2 is a block diagram illustrating an example of a hardware configuration of a memory controller included in the memory system according to the first embodiment.

FIG. 2 is a block diagram illustrating an example of a hardware configuration of the memory controller 1 included in the memory system MS according to the first embodiment. As illustrated in FIG. 2, the memory controller 1 includes, for example, a host interface circuit (host I/F) 10, a memory interface circuit (memory I/F) 11, a central processing unit (CPU) 12, an error correction code (ECC) circuit 13, a read-only memory (ROM) 14, a random access memory (RAN) 15, and a buffer memory 16. The host I/F 10, the memory I/F 11, the CPU 12, the ECC circuit 13, the ROM 14, the RAM 15, and the buffer memory 16 may be coupled to an internal bus.

The host I/F 10 controls communication conforming to an interface specification between the host device HD and the memory controller 1. The host I/F 10 is configured to be coupled to the host device HD via the host bus HB. The host I/F 10 supports an interface specification such as Serial Advanced Technology Attachment (SATA), Serial Attached SCSI (SAS), PCI Express (PCIe™), and Non-Volatile Memory Express™ (NVMe™).

The memory I/F 11 controls communication conforming to an interface specification between the memory controller 1 and the memory device 2. The memory I/F 11 is coupled to the memory device 2 via the memory bus MB. The memory I/F 11 supports an interface specification such as Toggle DDR and Open NAND Flash Interface (ONFI).

The CPU 12 is a processor that controls the overall operation of the memory controller 1. The CPU 12 instructs the memory device 2 to execute a data write operation via the memory I/F 11 in accordance with a write request received via the host I/F 10. The CPU 12 instructs the memory device 2 to execute a data read operation via the memory I/F 11 in accordance with a read request received via the host I/F 10.

The ECC circuit 13 is a circuit that executes ECC processing. The ECC processing includes data coding and decoding. The ECC circuit 13 encodes data to be written in the memory device 2, and decodes data that is read from the memory device 2.

The ROM 14 is a nonvolatile memory. The ROM 14 stores, for example, a program such as firmware. The ROM 14 is, for example, an electrically erasable programmable read-only memory (EEPROM™). The CPU 12 executes various processing by executing firmware stored in the ROM 14 or the like.

The RAM 15 is a volatile memory. The RAM 15 is used as a work area of the CPU 12. The RAM 15 is, for example, a static random access memory (SRAM) or a dynamic random access memory (DRAM).

The buffer memory 16 is, for example, a volatile memory. The buffer memory 16 temporarily stores data received via the host I/F 10, data received via the memory I/F 11, or the like. The buffer memory 16 is, for example, a DRAM or an SRAM. The buffer memory 16 may be mounted on an outside of the memory controller 1.

<1-1-3> Hardware Configuration of Memory Device 2

Figure 3:
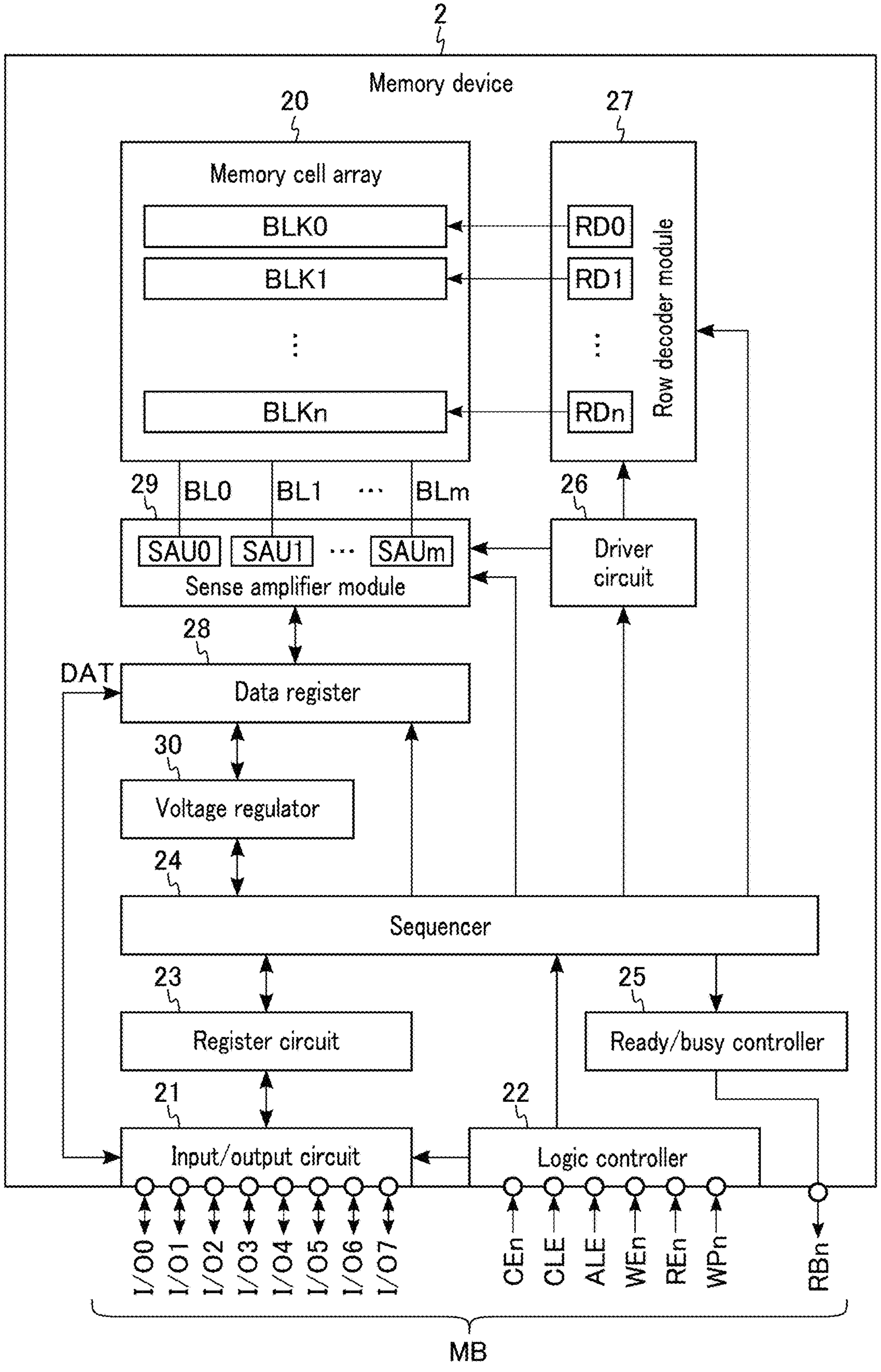
FIG. 3 is a block diagram illustrating an example of a hardware configuration of a memory device included in the memory system according to the first embodiment.

FIG. 3 is a block diagram illustrating an example of a configuration of the memory device 2 included in the memory system MS according to the first embodiment. As illustrated in FIG. 3, the memory device 2 includes, for example, a memory cell array 20, an input/output circuit 21, a logic controller 22, a register circuit 23, a sequencer 24, a ready/busy controller 25, a driver circuit 26, a row decoder module 27, a data register 28, a sense amplifier module 29, and a voltage regulator 30. Signals transmitted and received via the memory bus MB include, for example, input/output signals I/O0 to I/O7, control signals CEn, CLE, ALE, WEn, REn, and WPn, and a ready/busy signal RBn.

The memory cell array 20 is a set of the memory cell transistors MT. The memory cell array 20 includes a plurality of blocks BLK0 to BLKn ("n" is an integer of 1 or greater). The block BLK is used, for example, as a unit of a data erase operation. A block address is assigned to each of the blocks BLK. The memory cell array 20 is provided with a plurality of bit lines BL0 to BLm ("m" is an integer of 1 or greater) and a plurality of word lines WL (not illustrated).

The input/output circuit 21 controls transmission and reception (input/output) of the input/output signals I/O0 to I/O7. The input/output signal I/O can include, for example, data DAT, status information, an address, and a command. The input/output circuit 21 can input and output the data DAT between the data register 28 and the memory controller 1. The input/output circuit 21 can output the status information transferred from the register circuit 23 to the memory controller 1. The input/output circuit 21 can output each of the address and the command transferred from the memory controller 1 to the register circuit 23.

The logic controller 22 controls each of the input/output circuit 21 and the sequencer 24, based on each of the various control signals input from the memory controller 1. The logic controller 22 enables the memory device 2, based on the control signal CEn. The logic controller 22 notifies the input/output circuit 21 that the input/output signals I/O received by the memory device 2 are the command and the address, respectively, based on the control signals CLE and ALE. The logic controller 22 instructs the input/output circuit 21 to receive the input/output signal I/O, based on the control signal WEn, and instructs the input/output circuit 21 to transmit the input/output signal I/O, based on the control signal REn. The logic controller 22 brings the memory device 2 into a protection state, based on the control signal WPn.

The register circuit 23 temporarily stores status information, addresses, commands, and the like. The status information is information indicating an operation state of the memory device 2. The status information is updated based on the control of the sequencer 24, and transferred to the memory controller 1 via the input/output circuit 21. The addresses may include a block address, a page address, a column address, and the like. The commands include instructions relating to various operations of the memory device 2.

The sequencer 24 is a controller that controls the overall operation of the memory device 2. The sequencer 24 executes a read operation, a write operation, an erase operation, and the like, based on the command and the address stored in the register circuit 23. In addition, the sequencer 24 can execute on-chip tracking that includes deriving of an optimal value of a read voltage, and a read operation using the derived shift value. Details of the on-chip tracking will be described later.

The ready/busy controller 25 generates the ready/busy signal RBn under the control of the sequencer 24. The ready/busy signal RBn is a signal to notify the memory controller 1 of whether the memory device 2 is in a ready state or a busy state. The ready state is a state in which the memory device 2 can accept a command from the memory controller 1, and is notified by the ready/busy signal RBn at a high level. The busy state is a state in which the memory device 2 cannot accept a command from the memory controller 1, and is notified by the ready/busy signal RBn at a low level.

The driver circuit 26 generates voltages for use in a read operation, a write operation, an erase operation, and the like. The driver circuit 26 supplies the generated voltages to the row decoder module 27 and the sense amplifier module 29.

The row decoder module 27 is a circuit that is used for selecting a block BLK and supplying a voltage to interconnects, such as the word line WL. The row decoder module 27 includes a plurality of row decoders RD0 to RDn. The row decoders RD0 to RDn are associated with the blocks BLK0 to BLKn, respectively. Each of the row decoders RD can set the associated block BLK to be selected or unselected, based on the block address.

The data register 28 is a circuit that temporarily stores the data DAT. The data register 28 may be used to input and output the data DAT, for example, between the input/output circuit 21 and the sense amplifier module 29. In addition, the data register 28 outputs, in the on-chip tracking, the data read from the memory cell 20 array to the voltage regulator 30. The data register 28 is also referred to as a data latch, a page register, or a cache memory.

The sense amplifier module 29 is a circuit that is used for supplying a voltage to each bit line BL and reading data. The sense amplifier module 29 includes a plurality of sense amplifier units SAU0 to SAUm. The sense amplifier units SAU0 to SAUm are associated with the plurality of bit lines BL0 to BLm, respectively. Each of the sense amplifier units SAU can determine data read from a selected memory cell transistor MT, based on the voltage of the associated bit line BL.

The voltage regulator 30 includes a function of determining, in the on-chip tracking, an optimal shift value of a read voltage, based on the instruction of the sequencer 24 and the data DAT transferred from the data register 28. A detailed configuration of the voltage regulator 30 will be described later.

Note that in the memory device 2, a set of the memory cell array 20, the row decoder module 27, and the sense amplifier module 29 may also be referred to as a plane. The plane includes at least the memory cell array 20. The memory device 2 may include a plurality of planes. The sequencer 24 can be configured to be capable of controlling each of the planes.

Hereinafter, examples of detailed circuit configurations of the memory cell array 20, the row decoder module 27, the data register 28, and the sense amplifier module 29 will be described.

(1: Circuit Configuration of Memory Cell Array 20)

Figure 4:
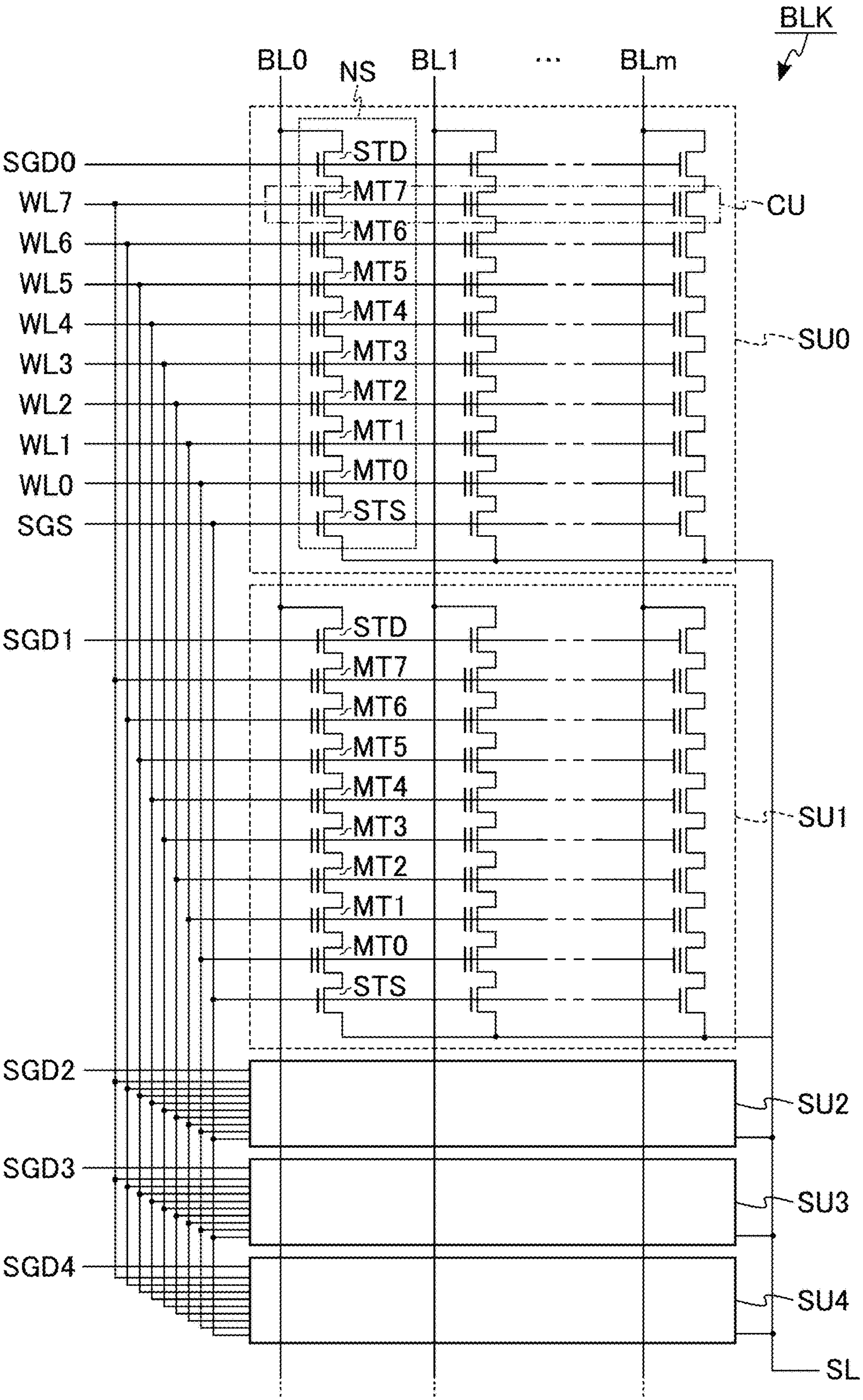
FIG. 4 is a diagram illustrating an example of a circuit configuration of a memory cell array included in the memory device according to the first embodiment.

FIG. 4 is a diagram illustrating an example of a circuit configuration of the memory cell array 20 according to the first embodiment. FIG. 4 illustrates one of the plurality of blocks BLK included in the memory cell array 20. As illustrated in FIG. 4, the block BLK is provided with a plurality of bit lines BL0 to BLm, a plurality of word lines WL0 to WL7, select gate lines SGD0 to SGD4, a select gate line SGS, and a source line SL. The select gate lines SGD0 to SGD4 and SGS and the word lines WL0 to WL7 are provided for each block BLK. The bit lines BL0 to BLm are shared by a plurality of blocks BLK. The source line SL may be shared by a plurality of blocks BLK, or may be provided for each block BLK.

The block BLK includes, for example, five string units SU0 to SU4. Each string unit SU includes a plurality of NAND strings NS. The plurality of NAND strings NS are associated with the bit lines BL0 to BLm, respectively. Specifically, each bit line BL is shared by the NAND string NS to which the same column address is assigned among the plurality of blocks BLK. Each NAND string NS is coupled between the associated bit line BL and source line SL.

Each NAND string NS includes, for example, memory cell transistors MT0 to MT7 and select transistors STD and STS. Each memory cell transistor MT is a memory cell including a control gate and a charge storage layer, and holds (stores) data in a nonvolatile manner. The threshold voltage of the memory cell transistor MT can be changed based on the amount of charge injected into the charge storage layer or the like. The memory cell transistor MT stores data corresponding to the threshold voltage. Each of the select transistors STD and STS is used to select the string unit SU.

In each NAND string NS, the select transistor STD, the memory cell transistors MT7 to MT0, and the select transistor STS are coupled in series in this order. Specifically, the drain of the select transistor STD is coupled to the associated bit line BL. The source of the select transistor STD is coupled to the drain of the memory cell transistor MT7. The drain of the select transistor STS is coupled to the source of the memory cell transistor MT0. The source of the select transistor STS is coupled to the source line SL. The memory cell transistors MT0 to MT7 are coupled in series between the select transistors STD and STS.

The select gate lines SGD0 to SGD4 are associated with the string units SU0 to SU4, respectively. Each select gate line SGD is coupled to the gate of each of the plurality of select transistors STD included in the associated string unit SU. The select gate line SGS is coupled to the gate of each of the plurality of select transistors STS included in the associated block BLK. The word lines WL0 to WL7 are coupled to the control gates of the plurality of memory cell transistors MT0 to MT7 included in the associated block BLK, respectively.

In the present specification, a set of the plurality of memory cell transistors MT commonly coupled to the word line WL in one string unit SU is referred to as a cell unit CU. In the present specification, a set of 1-bit data stored in each of the plurality of memory cell transistors MT included in the cell unit CU is referred to as page data. The cell unit CU can store data of two or more pages according to the number of bits of data stored in each memory cell transistor MT.

Note that the memory cell array 20 may have a circuit configuration other than the above. For example, the number of the string units SU included in each block BLK and the number of the memory cell transistors MT and the select transistors STD and STS included in each NAND string NS can be designed to any numbers.

(2: Circuit Configuration of Row Decoder Module 27)

Figure 5:
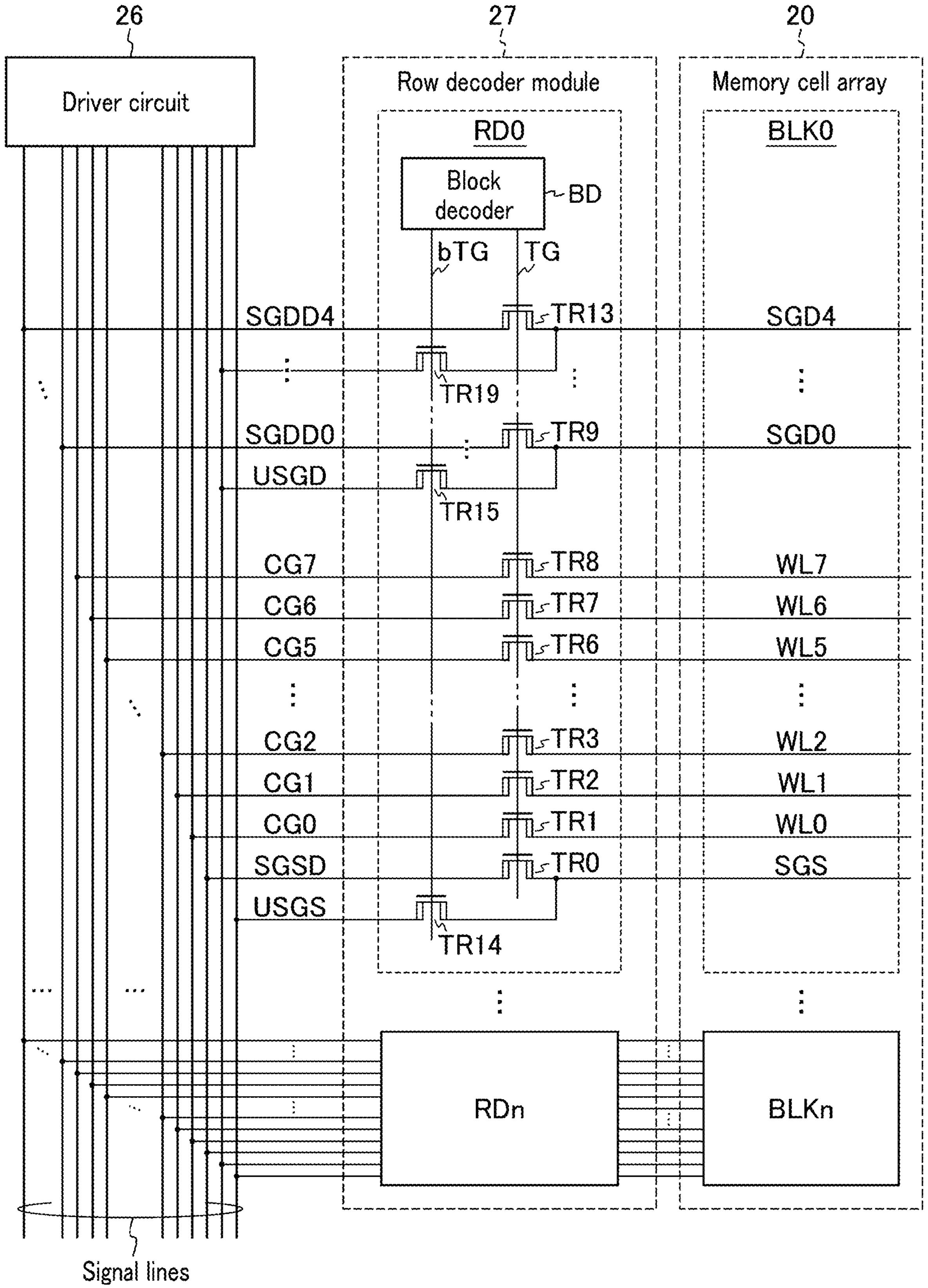
FIG. 5 is a diagram illustrating an example of a circuit configuration of a row decoder module included in the memory device according to the first embodiment.

FIG. 5 is a diagram illustrating an example of a circuit configuration of the row decoder module 27 according to the first embodiment. FIG. 5 illustrates a connectivity relationship between each of the driver circuit 26 and the memory cell array 20, and the row decoder module 27, and illustrates a detailed circuit configuration of one row decoder RD0. Note that the circuit configuration of the row decoder RD other than the row decoder RD0 is similar to that of the row decoder RD0. As illustrated in FIG. 5, each row decoder RD is coupled to signal lines CG0 to CG7, SGDD0 to SGDD4, SGSD, USGD, and USGS coupled to the driver circuit 26. In addition, each row decoder RD is coupled to the word lines WL0 to WL7 of the associated block BLK, and the select gate lines SGD0 to SGD4 and SGS.

The row decoder RD0 includes, for example, transistors TR0 to TR19, transfer gate lines TG and bTG, and a block decoder BD. Each of the transistors TR0 to TR19 is an N-type high breakdown voltage transistor. The transfer gate line TG is coupled to the gates of the transistors TR0 to TR13. The transfer gate line bTG is coupled to the gates of the transistors TR14 to TR19. The drains of the transistors TR0 to TR13 are coupled to the signal lines SGSD, CG0 to CG7, and SGDD0 to SGDD4, respectively. Sources of the transistors TR0 to TR13 are coupled to the select gate line SGS, the word lines WL0 to WL7, and the select gate lines SGD0 to SGD4 of the block BLK0, respectively. The drain and the source of the transistor TR14 are coupled to the signal line USGS, and the select gate line SGS of the block BLK0, respectively. The drains of the transistors TR15 to TR19 are coupled to the signal line USGD. The sources of the transistors TR15 to TR19 are coupled to the select gate lines SGD0 to SGD4 of the block BLK0, respectively.

The block decoder BD is a circuit that decodes a block address. The block decoder BD applies one of a high level voltage and a low level voltage to the transfer gate line TG and applies the other of the high level voltage and the low level voltage to the transfer gate line bTG, based on the block address decoding result. Specifically, the block decoder BD of the selected block BLK applies a high-level voltage to the transfer gate line TG and applies a low-level voltage to the transfer gate line bTG. The block decoder BD of the unselected block BLK applies a low-level voltage to the transfer gate line TG and applies a high-level voltage to the transfer gate line bTG. Thereby, the voltages of the signal lines CG0 to CG7 are applied to the word lines WL0 to WL7 of the selected block BLK, respectively, the voltages of the signal lines SGDD0 to SGDD4 and SGSD are applied to the select gate lines SGD0 to SGD4 and SGS of the selected block BLK, respectively, and the voltages of the signal lines USGD and USGS are applied to the select gate lines SGD and SGS of the unselected block BLK, respectively.

Note that the row decoder module 27 may have a circuit configuration other than the above. For example, the number of transistors TR included in the row decoder module 27 can be appropriately changed in accordance with the number of interconnects of each block BLK. Since the signal line CG is shared by the plurality of blocks BLK, the signal line CG is also referred to as a global word line. Since the word line WL is provided for each block, it is also referred to as a local word line. Since each of the signal lines SGDD and SGSD is shared by the plurality of blocks BLK, the signal lines SGDD and SGSD are also referred to as global transfer gate lines. Each of the select gate lines SGD and SGS is provided for each block, and thus is also referred to as a local transfer gate line.

(3: Circuit Configuration of Sense Amplifier Module 29 and Data Register 28)

Figure 6:
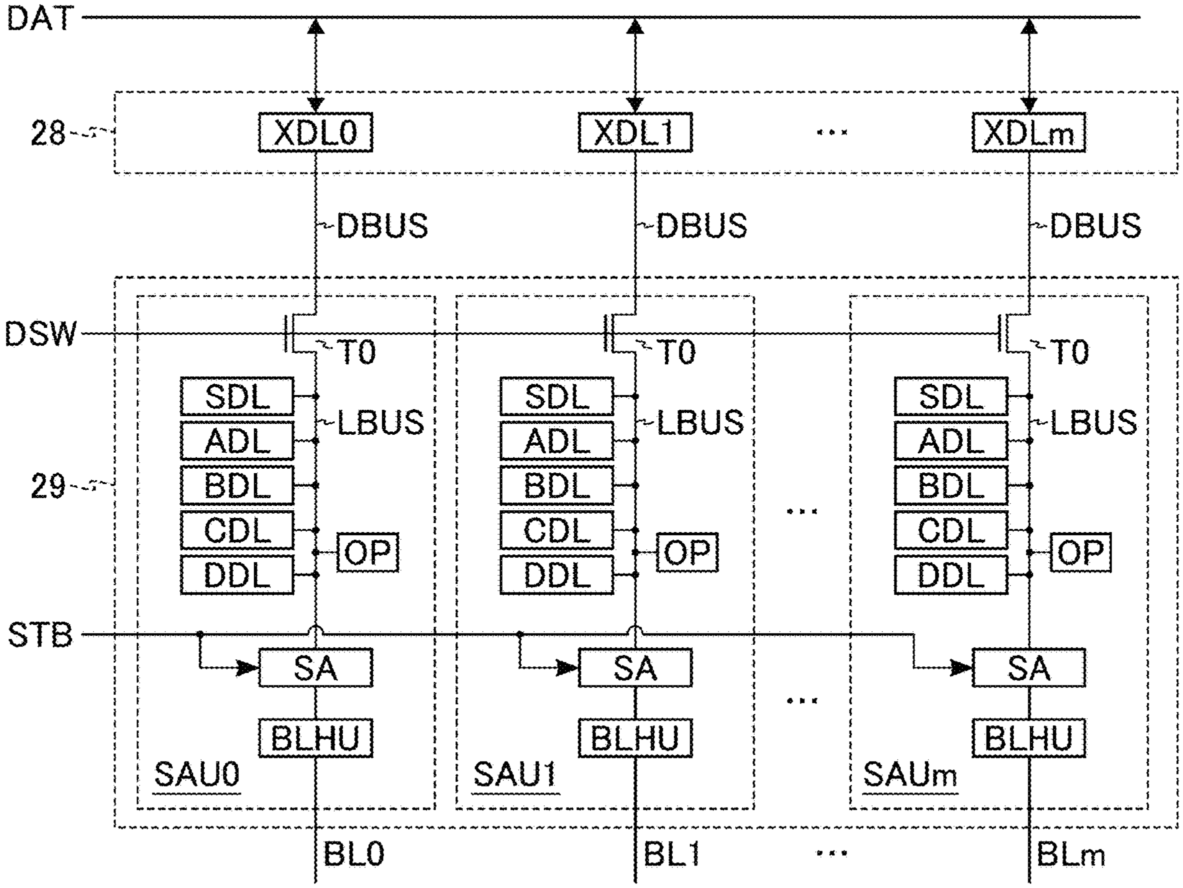
FIG. 6 is a diagram illustrating an example of a circuit configuration of a sense amplifier module and a data register included in the memory device according to the first embodiment.

FIG. 6 is a diagram illustrating an example of a circuit configuration of the sense amplifier module 29 and the data register 28 according to the first embodiment. As illustrated in FIG. 6, each sense amplifier unit SAU includes, for example, a bit line connection section BLHU, a sense amplifier section SA, buses DBUS and LBUS, latch circuits SDL, ADL, BDL, CDL and DDL, an arithmetic section OP and a transistor T0. The data register 28 includes a plurality of latch circuits XDL0 to XDLm. The latch circuits XDL0 to XDLm are associated with the sense amplifier units SAU0 to SAUm, respectively. Each of the latch circuits XDL0 to XDLm is coupled to the associated sense amplifier unit SAU via the bus DBUS.

The bit line connection section BLHU is, for example, a protection circuit that prevents a high voltage applied to the channel of the NAND string NS in the erase operation from being applied to the sense amplifier section SA. The bit line connection section BLHU may be configured to be capable of applying a predetermined voltage to the unselected bit lines BL.

The sense amplifier section SA is a circuit that is used for determining data, based on a voltage of the bit line BL, and applying a voltage to the bit line BL. Each sense amplifier section SA is coupled to the associated bit line BL via the bit line connection section BLHU. If a control signal STB is asserted at a time of a read operation, the sense amplifier section SA determines whether data read from the selected memory cell transistor MT is “0” bit data or “1” bit data, based on the voltage of the associated bit line BL. The control signal STB is generated by, for example, the sequencer 24.

Each of the latch circuits SDL, ADL, BDL, CDL and DDL can temporarily store data. The latch circuits SDL, ADL, BDL, CDL and DDL, and the sense amplifier section SA, are configured to be capable of transmitting and receiving data via the bus LBUS.

The arithmetic section OP executes various logic operations by using data stored in the latch circuits SDL, ADL, BDL, CDL and DDL. Note that the sense amplifier unit SAU may include an arithmetic circuit that executes various logic operations, in place of the arithmetic section OP.

The transistor TO of each sense amplifier unit SAU controls transfer of a signal between the associated buses DBUS and LBUS. One end of the transistor TO of each sense amplifier unit SAU is coupled to the associated bus DBUS. The other end of the transistor TO of each sense amplifier unit SAU is coupled to the associated bus LBUS. A control signal DSW is input to the gate of the transistor TO of each sense amplifier unit. The control signal DSW is generated by, for example, the sequencer 24.

Each of the latch circuits XDL can temporarily store data. Each of the latch circuits XDL is configured to be capable of transmitting and receiving data to and from the associated sense amplifier unit SAU via the bus DBUS. Each of the latch circuits XDL is used for the input/output of data DAT between the sense amplifier module 29 and the input/output circuit 21. Each of the latch circuits XDL may be shared by a plurality of sense amplifier units SAU.

Note that the sense amplifier module 29 may have a circuit configuration other than the above. For example, the number of latch circuits included in each sense amplifier unit SAU can be appropriately changed. The arithmetic section OP may be omitted from the sense amplifier unit SAU.

<1-1-4> Threshold Voltage Distribution of Memory Cell Transistors MT

Figure 7:
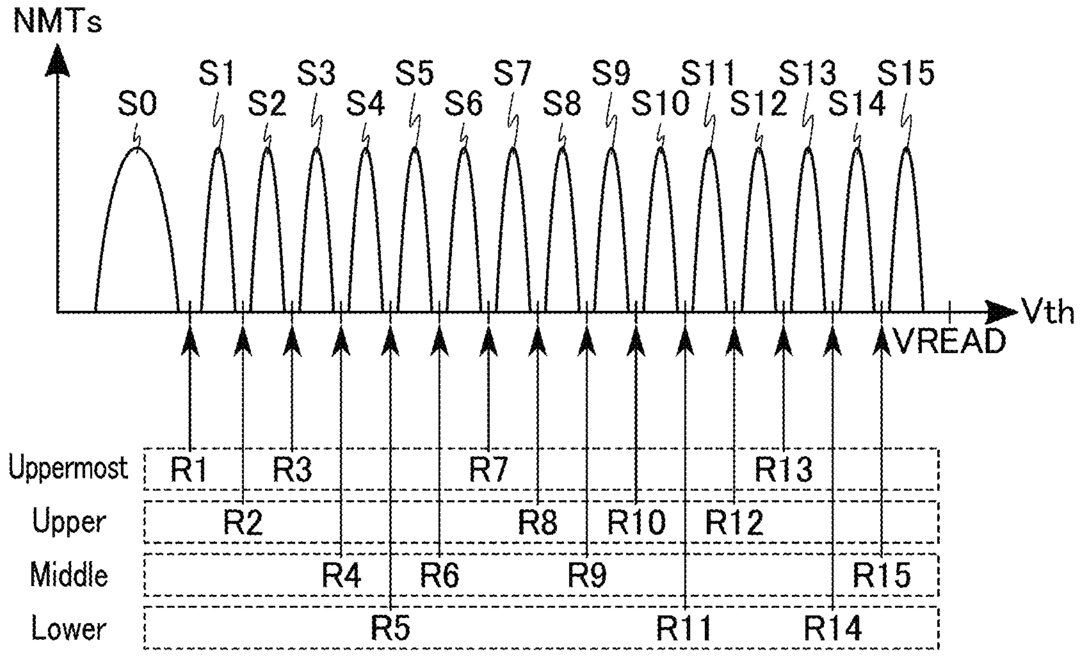
FIG. 7 is a schematic diagram illustrating an example of threshold voltage distribution and data allocation of memory cell transistors in the memory device according to the first embodiment.

FIG. 7 is a schematic diagram illustrating an example of threshold voltage distribution and data allocation of memory cell transistors MT in the memory system MS according to the first embodiment. "NMTs" on the vertical axis indicates the number of memory cell transistors MT. "Vth" on the horizontal axis indicates the threshold voltage of the memory cell transistor MT. As illustrated in FIG. 7, in a case where each memory cell transistor MT stores 4-bit data (in a case of 4 bit/cell), the threshold voltage distribution of the memory cell transistors MT forms, for example, 16 states. Since data to be written in each cell unit CU is randomized, the memory cell transistors MT are substantially uniformly distributed in the 16 states.

In the present specification, these 16 states are referred to as state S0, state S1, state S2, state S3, state S4, state S5, state S6, state S7, state S8, state S9, state S10, state S11, state S12, state S13, state S14, and state S15 in the order from a lowest threshold voltage. Mutually different 4-bit data are allocated to the memory cell transistors MT belonging to the respective states S0 to S15. Note that data of two bits, three bits, or five bits or more may be stored in each memory cell transistor MT, or data different from that described below may be allocated to each memory cell transistor MT. The operation to be described below is also applicable to a case where the memory cell transistor MT stores multiple-bit data.

Hereinafter, an example of data allocation to the memory cell transistors MT belonging to the 16 states will be described. Note that the 4-bit data stored in each memory cell transistor MT is also referred to as top bit data, upper bit data, middle bit data, and lower bit data. Further, 1-page data configured by top bit data, upper bit data, middle bit data, and lower bit data stored in each of the plurality of memory cell transistors MT included in each cell unit CU is also referred to as top page data, upper page data, middle page data, and lower page data, respectively.

State S0: "1111" (top bit data/upper bit data/middle bit data/lower bit data)
State S1: "0111" data
State S2: "0011" data
State S3: "1011" data
State S4: "1001" data
State S5: "1000" data
State S6: "1010" data
State S7: "0010" data
State S8: "0110" data
State S9: "0100" data
State S10: "0000" data
State S11: "0001" data
State S12: "0101" data
State S13: "1101" data
State S14: "1100" data
State S15: "1110" data Read voltages are set between mutually neighboring states. Specifically, a read voltage R1 is set between states S0 and S1. A read voltage R2 is set between states S1 and S2. Similarly, read voltages R3 to R15 are set between mutually neighboring states. In other words, a read voltage Rj ("j" is an integer of 1 to 15) is set between state S (j−1) and state Sj. In addition, a read pass voltage VREAD is set to a voltage higher than that of the state having the highest threshold voltage (for example, state S15).

The read voltage is applied to the word line WL selected as a target of a read operation. A memory cell transistor MT included in a cell unit CU of the target of the read operation in the selected word line WL is turned on if the memory cell transistor MT has a threshold voltage lower than the applied read voltage. The read pass voltage VREAD is applied to the unselected word lines WL. The memory cell transistors MT coupled to the word lines WL to which the read pass voltage VREAD is applied are turned on regardless of data stored therein.

If the data allocation illustrated in FIG. 7 is applied, the lower page data is determined by read operations using the read voltages R5, R11, and R14. The middle page data is determined by read operations using the read voltages R4, R6, R9 and R15. The upper page data is determined by read operations using the read voltages R2, R6, R9 and R15. The top page data is determined by read operations using the read voltages R1, R3, R7 and R13. In the read operations of page data using a plurality of read voltages, arithmetic processing is executed as needed in the sense amplifier unit SAU.

Note that the data allocation illustrated in FIG. 7 is also referred to as "3-4-4-4 coding", since the lower, middle, upper and top page data are determined by three-time read, four-time read, four-time read and four-time read, respectively. The top bit data and the top page may be referred to as a top bit and a top page, respectively.

<1-1-5> Configuration of Voltage Regulator 30

Figure 8:
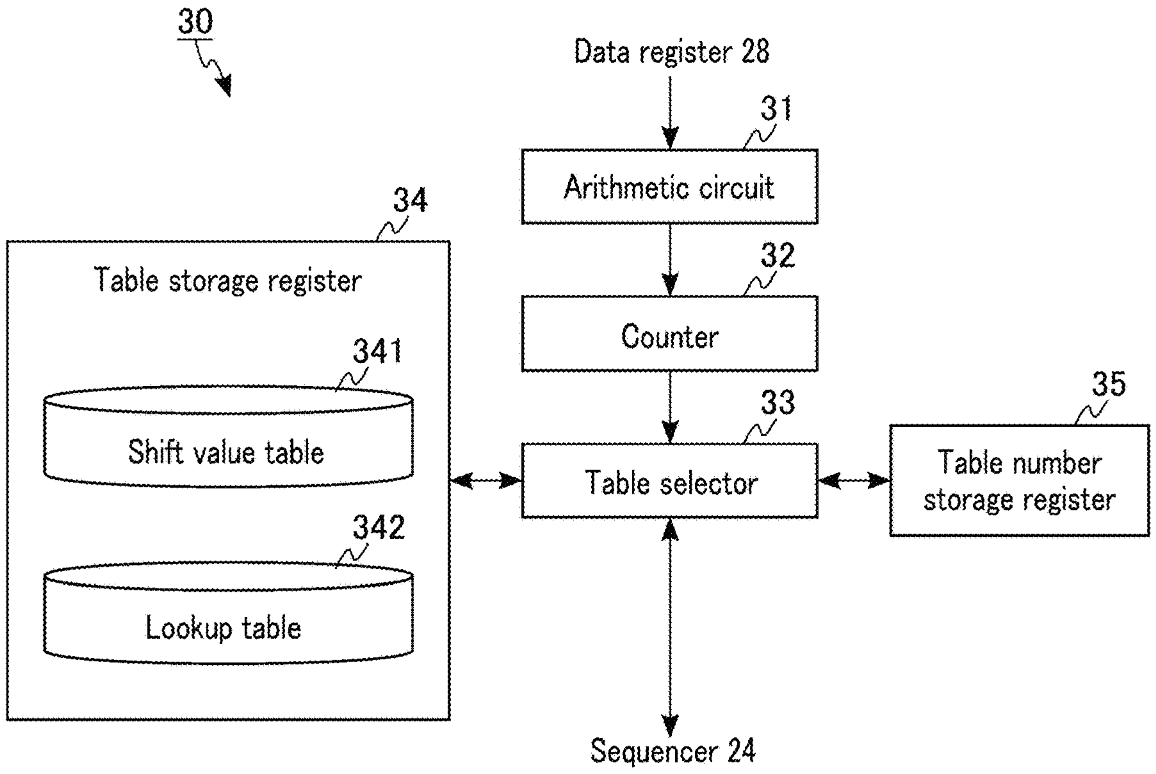
FIG. 8 is a block diagram illustrating an example of a configuration of a voltage regulator included in the memory device according to the first embodiment.

FIG. 8 is a block diagram illustrating an example of a configuration of the voltage regulator 30 included in the memory device 2 according to the first embodiment. As illustrated in FIG. 8, the voltage regulator 30 includes, for example, an arithmetic circuit 31, a counter 32, a table selector 33, a table storage register 34, and a table number storage register 35.

The arithmetic circuit 31 is a circuit capable of executing an exclusive OR (XOR) operation of data received from the data register 28. Specifically, the arithmetic circuit 31 receives, from the data register 28, a result of a first read operation and a result of a second read operation. In addition, the arithmetic circuit 31 executes an XOR operation between the result of the first read operation and the result of the second read operation. At this time, the arithmetic circuit 31 executes an XOR operation between the data determined by the same sense amplifier unit SAU. In addition, the arithmetic circuit 31 includes a thinning-out mechanism capable of executing a thinning-out process of data received from the data register 28. The thinning-out mechanism reduces the amount of data received from the data register 28. The thinning-out amount of data by the thinning-out process is designed based on the performance of the counter 32. For example, in a case where the counter 32 is an 8-bit counter, the thinning-out mechanism is configured to thin out the data received from the data register 28 to 1/16 by the thinning-out process.

The counter 32 receives the result of the XOR operation from the arithmetic circuit 31. Further, the counter 32 counts the number of "1" bit data included in the received result of the XOR operation. Then, the counter 32 outputs a count result to the table selector 33.

The table selector 33 selects an index number of a shift value table 341 corresponding to an optimal shift value of the read voltage, from the count result (count value) received from the counter 32, by using the information of a lookup table 342. In addition, the table selector 33 writes the selected index number into the table number storage register 35. Further, the table selector 33 outputs information corresponding to the selected index number in the shift value table 341 to the sequencer 24. The sequencer 24 can execute the read operation, based on the information of the shift value table 341 received from the table selector 33.

The table storage register 34 stores the shift value table 341 and the lookup table 342. The shift value table 341 stores information relating to the shift value of the read voltage, in regard to each of index numbers. The lookup table 342 stores information that correlates the index number of the shift value table 341 with the count result of the counter 32. For example, values read out from a predetermined ROM area of the memory 2 are used as the values of the shift value table 341 and lookup table 342.

The table number storage register 35 stores the index number of the shift value table 341 selected by the table selector 33. The table number storage register 35 may manage the index number in regard to each predetermined group. For example, the table number storage register 35 may be configured to share the same index number in regard to each block BLK, or may be configured to share the same index number in regard to each word line WL. An operation in a case where the index number is shared will be described in a third embodiment.

Note that the shift value table 341 and the lookup table 342 are created, for example, based on the data acquired by stress tests or the like conducted in advance. In addition, the created shift value table 341 and lookup table 342 are set in a predetermined storage area (ROM area) of the memory cell array 20, before shipment of the memory device 2. In the voltage regulator 30, the thinning-out process by the thinning-out mechanism of the arithmetic circuit 31 may be executed after the execution of the XOR operation. The thinning-out mechanism may be omitted from the arithmetic circuit 31 of the voltage regulator 30. In this case, the thinning-out process is executed by the data transferred from the data register 28 to the arithmetic circuit 31 being thinned out, without using the arithmetic circuit 31. Besides, the thinning-out process may be executed at a time of read. In a case where the thinning-out process is executed at a time of read, the read time can be shortened since the number of read data decreases. Aside from this, it suffices that the memory device 2 according to the first embodiment is configured to be capable of executing the thinning-out process.

<1-2> Operation

Next, an operation of the memory system MS according to the first embodiment will be described.

<1-2-1> Outline of Vth Tracking

Figure 9:
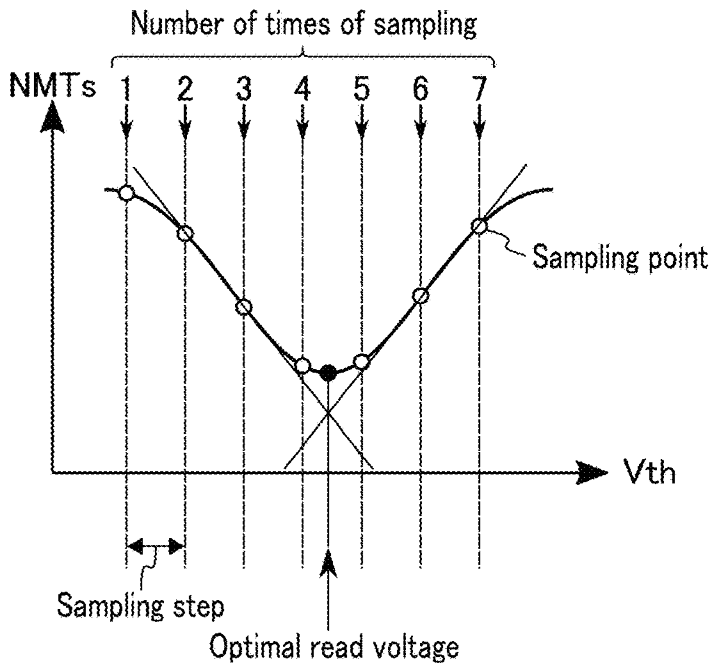
FIG. 9 is a schematic diagram illustrating an outline of Vth tracking.

First, an outline of Vth tracking is described. The Vth tracking is an operation of searching for a dip position between two adjacent states (hereinafter, referred to as adjacent states) and estimating an optimal read voltage. The optimal read voltage is a value of the read voltage at which the number of error bits (fail bits) becomes minimum at a time when the read operation is executed. The Vth tracking is also referred to as a tracking operation. FIG. 9 is a schematic diagram illustrating an outline of the Vth tracking. "NMTs" on the vertical axis indicates the number of memory cell transistors MT. "Vth" on the horizontal axis indicates the threshold voltage of the memory cell transistors MT. In addition, FIG. 9 illustrates a vicinity of a dip position of adjacent states, and elements relating to the Vth tracking.

As illustrated in FIG. 9, in the Vth tracking, shift read is executed multiple times in accordance with the setting of a preset read voltage. Each shift read is a read operation in which a shift amount of voltage from a start read level is designated. The number of times of execution of shift read corresponding to the number of times of sampling. The number of times of sampling in the present example is seven. In addition, locations where sampling (shift read) is executed are indicated as sampling points. The shift amount is designated by, for example, a digital-to-analog converter (DAC) value. In multiple-time shift read in the Vth tracking, a plurality of read levels set at equal intervals are used. The interval of mutually neighboring read levels corresponds to a sampling step that corresponds to a voltage width between samplings.

Then, the number of memory cell transistors MT turned on at each read level (also referred to as the number of on-cells) is counted, and a difference between the numbers of on-cells at two adjacent read levels is calculated. Further, a point at which histogram generation by the counted cell numbers is executed and the plot of the difference between the numbers of on-cells is convex downward, that is, a point at which the difference between the numbers of on-cells is the minimum, is extracted (minimum value detection). Thereafter, the ratio between two differences adjacent to the minimum point is calculated, and the voltage difference (potential difference) between the two read levels adjacent to the minimum point is internally divided by the calculated ratio (internal division ratio process). The voltage thus obtained is estimated to be the optimal read level. The series of processes of the Vth tracking can be executed, for example, in an on-chip manner by the memory device 2, without through the memory controller 1.

Figure 10:
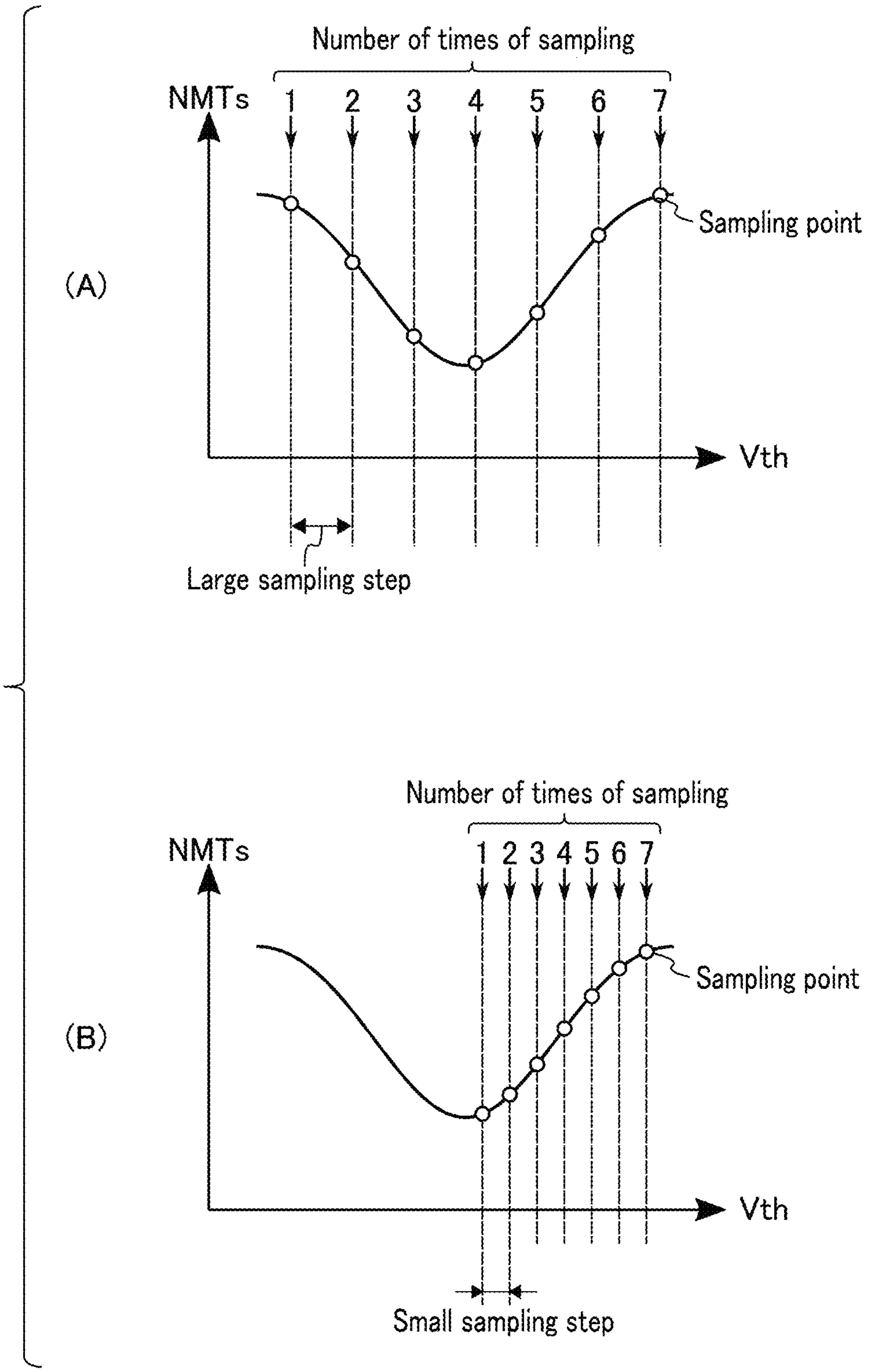
FIG. 10 is a schematic diagram illustrating a specific example of a setting in the Vth tracking.

Note that in order for the memory device 2 to quickly execute the Vth tracking, it is preferable that the number of times of sampling is smaller. In the Vth tracking, the sampling start point, the sampling step and the number of times of sampling can be adjusted by the register setting. The register setting in the Vth tracking is determined, for example, from an evaluation result to which stress is applied in advance by using the typical memory device 2. FIG. 10 is a schematic diagram illustrating a specific example of a setting in the Vth tracking. Parts (A) and (B) of FIG. 10 illustrate cases in which the number of times of sampling is seven and the sampling step is different in the setting of the Vth tracking.

In a case of securing a wide sampling range with a small number of times of sampling, it is conceivable to set a large sampling step, as illustrated in part (A) of FIG. 10 ("large sampling step" in FIG. 10). In this case, the possibility is high that the sampling range includes a dip position of adjacent states, and it becomes possible to adapt to a change of the threshold voltage distribution due to various stresses. In the meantime, the accuracy of the internal division ratio process lowers, and there is concern that the estimation accuracy of the optimal read voltage deteriorates.

On the other hand, in order to maintain the estimation accuracy of the optimal read voltage, it is conceivable to set a small sampling step, as illustrated in part (B) of FIG. 10 ("small sampling step" in FIG. 10). However, if the sampling step becomes smaller, since the sampling range becomes smaller, the possibility is high that the dip position of adjacent states is not included in the sampling range. Specifically, in a case where the sampling step is small with a small number of times of sampling, there is concern that it is not possible to adapt to a change of the threshold voltage distribution due to various stresses. In other words, there is concern that it is not possible to maintain the tolerance to various stresses.

Accordingly, in the Vth tracking, at least a predetermined number of times of sampling is necessary in order to compatibly maintain the estimation accuracy of the optimal read voltage and the stress tolerance. However, if consideration is given to the time needed for the read-out from the memory cell array 20 to the data register 28, an upper limit or a restriction in combination may occur in regard to the setting of the sampling step and the number of times of sampling. For example, it is difficult to perform such adjustment as to sufficiently increase the number of times of sampling by a degree corresponding to the decrease in the sampling step, without changing the sampling range.

It is thus desired to compatibly maintain the estimation accuracy of the optimal read voltage and the stress tolerance, and to realize high-speed Vth tracking. Therefore, the memory device 2 according to the first embodiment executes on-chip tracking that can estimate the optimal read voltage with a small number of times of sampling.

<1-2-2> On-Chip Tracking

The memory device 2 according to the first embodiment counts, in the on-chip tracking, the number of memory cells having a state corresponding to a higher state side (for example, state S15) among the states, and executes a read operation for the memory cells by using the read voltage that is shifted based on the count result. Hereinafter, the details of the on-chip tracking of the memory device 2 according to the first embodiment are described.

(1: Process Flow of On-Chip Tracking)

Figure 11:
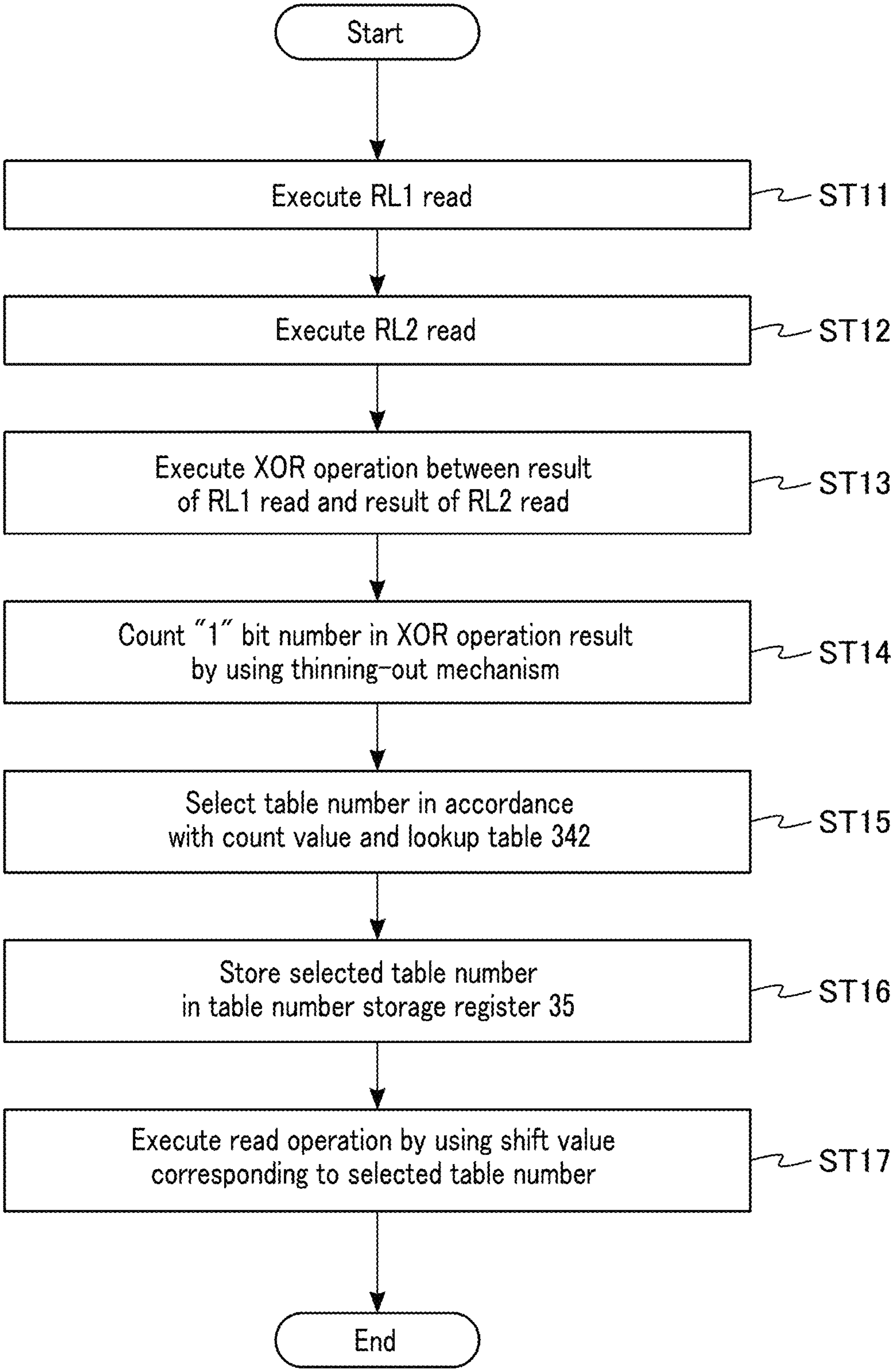
FIG. 11 is a flowchart illustrating an example of a process flow of on-chip tracking of the memory device according to the first embodiment.

FIG. 11 is a flowchart illustrating an example of a process flow of on-chip tracking of the memory device 2 according to the first embodiment. The memory device 2 according to the first embodiment starts a series of processes of FIG. 11, for example, upon receiving the address of a read-target page and an instruction for execution of on-chip tracking from the memory controller 1.

To start with, the memory device 2 executes RL1 read (step ST11). The RL1 read is a read operation using a read voltage RL1. The RL1 read corresponds to single-state read for a first read point. The read voltage RL1 is set to overlap, for example, a highest state (for example, state S15).

Next, the memory device 2 executes RL2 read (step ST12). The RL2 read is a read operation using a read voltage RL2. The RL2 read corresponds to single-state read for a second read point that is different from the first read point. The read voltage RL2 is set to overlap, for example, the highest state (for example, state S15), and is a voltage higher than the read voltage RL1.

Subsequently, the memory device 2 executes an XOR operation between the result of the RL1 read and the result of the RL2 read (step ST13). In the process of step ST13, the XOR operation using the result of the RL1 read and the result of the RL2 read is executed for each of the corresponding sense amplifier units SAU.

Next, the memory device 2 counts a "1" bit number (the number of "1" bit data) in the XOR operation result by utilizing a thinning-out mechanism (step ST14). The thinning-out mechanism adjusts a thinning-out amount, for example, so as to set a 255-bit estimation at maximum. Then, the counter 32 counts the "1" bit number included in the thinned-out XOR operation result. Note that in the process of step ST14, the counter 32 is controlled not to cause an overflow. For example, in a case where the counter 32 is an 8-bit counter, the count value is stopped at a 255 count.

Subsequently, the memory device 2 selects a table number in accordance with the count value and the lookup table 342 (step ST15). Specifically, using the lookup table 342, the table selector 33 selects the table number (index number) of the shift value table 341 corresponding to the count value of step ST14.

Next, the memory device 2 stores the selected table number in the table number storage register 35 (step ST16). Note that in step ST16, for example, if the table number storage register 35 already stores the table number associated with the same address, the table number is overwritten with a newly selected table number.

Subsequently, the memory device 2 executes a read operation by using a shift value corresponding to the selected table number (step ST17). Specifically, the sequencer 24 derives an optimal read voltage to be used, based on the shift value corresponding to the selected table number, and executes the read operation by using the optimal read voltage.

In the above description, the case was described in which the shift value table 341 and the lookup table 342 are used in order to find the optimal shift value of the read voltage, but the embodiment is not limited to this. The memory device 2 according to the first embodiment may be configured to find the shift value of the read voltage by calculating a linear expression or the like, with the count value of step ST14 being set as a variable. In addition, the XOR operation may be executed by using the arithmetic section OP of each sense amplifier unit SAU. In this case, the data to which the XOR operation is applied is transferred to the data register 28, and, after the thinning-out process is applied to the data, the data is output to the counter 32.

(2: Command Sequence)

Figure 12:
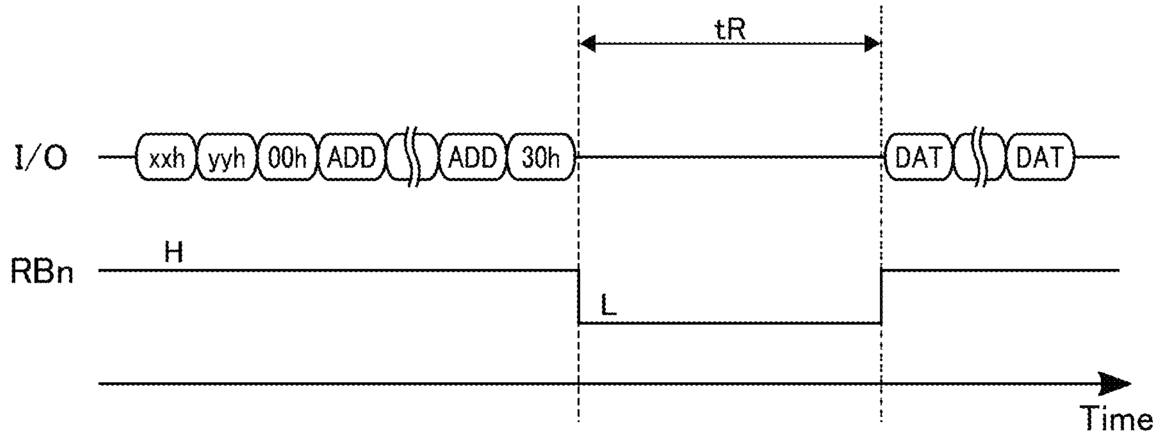
FIG. 12 is a schematic diagram illustrating an example of a command sequence of the on-chip tracking in the memory device according to the first embodiment.

FIG. 12 is a schematic diagram illustrating an example of a command sequence of the on-chip tracking in the memory device 2 according to the first embodiment. FIG. 12 illustrates the input/output signal I/O and the ready/busy signal RBn in a case where on-chip tracking is executed. Note that, before the start of the operation, the ready/busy signal RBn is at "H" level (high level: ready state).

As illustrated in FIG. 12, the memory controller 1 first sends to the memory device 2 a command "xxh", a command "yyh", a command "00h", an address "ADD" and a command "30h" in the named order. The command "xxh" is a command that instructs the use of on-chip tracking. The command "yyh" is a command that instructs an operation corresponding to a specific page. The command "yyh" is changed in accordance with a read-target page. The command "00h" is a command that instructs a read operation. The address "ADD" may include information of a read-target block BLK, string unit SU, word line WL and the like. The address "ADD" may be sent in multiple cycles. The command "30h" is a command that instructs the memory device 2 to start the read operation based on the command and address stored in the register circuit 23.

If the command "30h" is stored in the register circuit 23, the sequencer 24 transitions the memory device 2 from a ready state (RBn="H") to a busy state (RBn="L" (low level: busy state), thus starting the on-chip tracking. In FIG. 12, a period in which the on-chip tracking is executed is indicated by tR.

If the on-chip tracking is completed, the sequencer 24 transitions the memory device 2 from the busy state to the ready state. Upon detecting the end of the read operation, based on the change of the ready/busy signal RBn, the memory controller 1 causes the memory device 2 to successively output the read result (data DAT), for example, by toggling the control signal REn.

(3: Operation Waveform of On-Chip Tracking)

Figure 13:
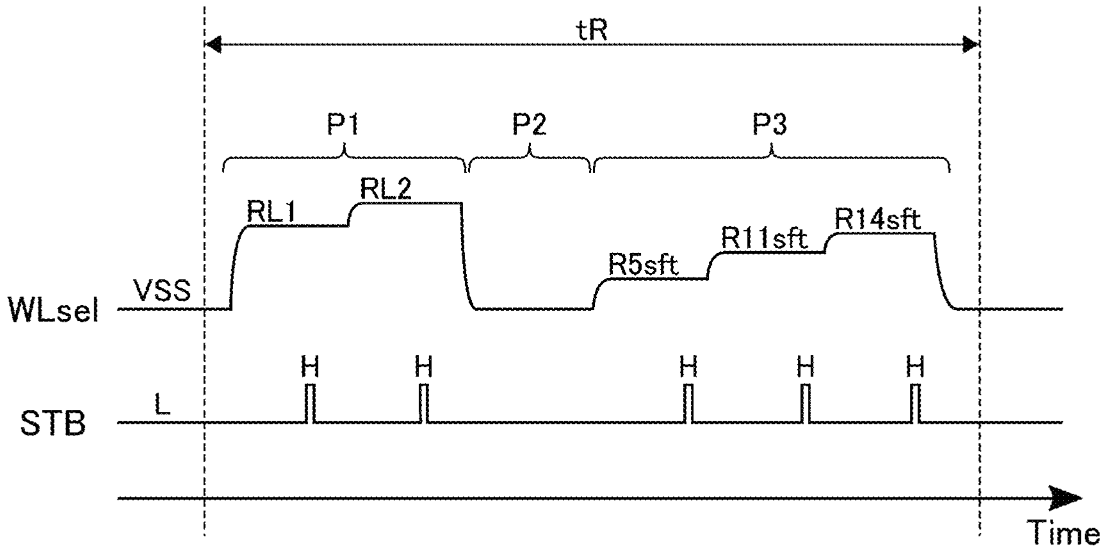
FIG. 13 is a schematic diagram illustrating an example of an operation waveform of the on-chip tracking of the memory device according to the first embodiment.

FIG. 13 is a schematic diagram illustrating an example of an operation waveform in the on-chip tracking of the memory device 2 according to the first embodiment. FIG. 13 illustrates a voltage of a selected word line WLsel, and a control signal STB. Note that in the initial state before the start of the operation, the voltage of the selected word line WLsel is VSS, and the control signal STB is at low level ("L"). Hereinafter, a case is described in which on-chip tracking is executed for a lower page as a target.

As illustrated in FIG. 13, the period in which the on-chip tracking is executed in the first embodiment includes three periods P1, P2 and P3. The period P1 corresponds to a period in which a read operation (sampling) is executed for collecting information for selecting an optimal shift value of the read voltage. The period P2 corresponds to a period in which the optimal shift value of the read voltage is selected based on the information collected in the period P1. The period P3 corresponds to a period for executing a read operation utilizing the optimal read voltage based on the optimal shift value of the read voltage selected in the period P2.

Specifically, in the period P1, the sequencer 24 applies a read pass voltage VREAD to an unselected word line WL (not illustrated). In addition, the sequencer 24 applies a read voltage RL1 to a selected word line WLsel, and asserts the control signal STB. Then, the read result is stored in any one of the latch circuits of each sense amplifier unit SAU (step ST11 in FIG. 11). Next, the sequencer 24 applies a read voltage RL2 to the selected word line WLsel, and asserts the control signal STB. Then, the read result is stored in any one of the latch circuits of each sense amplifier unit SAU (step ST12 in FIG. 11).

In the period P2, the sequencer 24 controls the voltage regulator 30, and selects the optimal shift value of the read voltage, based on the result of the read operation in the period P1 (step ST13 to ST16 in FIG. 11).

In the period P3, the sequencer 24 applies the read pass voltage VREAD to the unselected word line WL (not illustrated). In addition, the sequencer 24 successively applies optimal read voltages R5sft, R11sft and R14sft to the selected word line WLsel, and asserts the control signal STB in each of periods in which the optimal read voltages R5sft, R11sft and R14sft are applied. The optimal read voltage R5sft is a read voltage R5 in which the optimal shift value is applied to a reference value of the read voltage R5. The optimal read voltage R11sft is a read voltage R11 in which the optimal shift value is applied to a reference value of the read voltage R11. The optimal read voltage R14sft is a read voltage R14 in which the optimal shift value is applied to a reference value of the read voltage R14. The sequencer 24 determines the lower page data, based on the read results using the optimal read voltages R5sft, R11sft and R14sft. Then, the sequencer 24 stores the determined data in the data register 28.

The above-described operation can similarly be executed in a case where on-chip tracking in which another page is selected is executed.

(4: Outline of Count Target)

Figure 14:
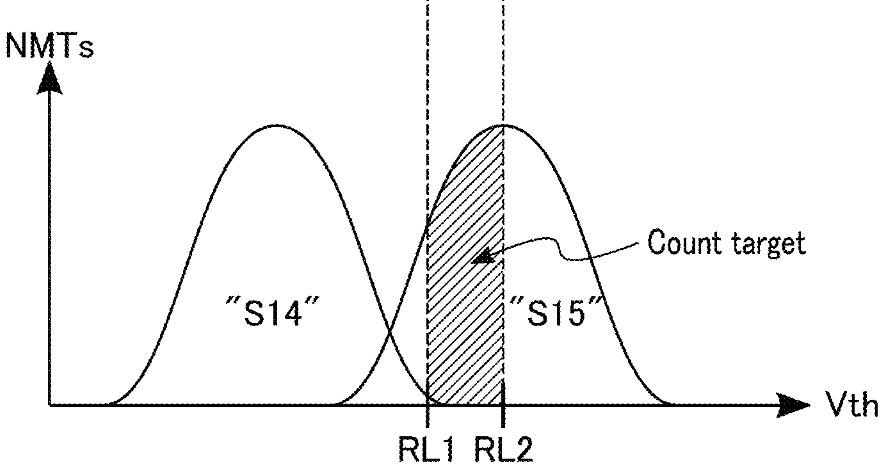
FIG. 14 is a schematic diagram illustrating an outline of a count target in the on-chip tracking of the memory device according to the first embodiment.

FIG. 14 is a schematic diagram illustrating an outline of a count target in the on-chip tracking of the memory device 2 according to the first embodiment. FIG. 14 illustrates a correspondence relationship between the state S14 and state S15 in the threshold voltage distribution of memory cell transistors MT, the result of the RL1 read, the result of the RL2 read, and the XOR operation result. As illustrated in FIG. 14, in the present example, the read voltages RL1 and RL2 are set to overlap the state S15 that is the highest state.

In the RL1 read, "1" bit data is read from the memory cell transistor MT having the threshold voltage that is equal to or less than the read voltage RL1, and "0" bit data is read from the memory cell transistor MT having the threshold voltage that is higher than the read voltage RL1. In the RL2 read, "1" bit data is read from the memory cell transistor MT having the threshold voltage that is equal to or less than the read voltage RL2, and "0" bit data is read from the memory cell transistor MT having the threshold voltage that is higher than the read voltage RL2.

As a result, the XOR operation result between the RL1 read result and the RL2 read result is "0" bit data in the memory cell transistor MT having the threshold voltage that is equal to or less than the read voltage RL1, is "1" bit data in the memory cell transistor MT having the threshold voltage that is higher than the read voltage RL1 and is equal to or less than the read voltage RL2, and is "0" bit data in the memory cell transistor MT having the threshold voltage that is higher than the read voltage RL2. Thus, the count target in the process of step ST14 of FIG. 11 corresponds to the number of memory cell transistors MT (the number of "1" bit data) having threshold voltages that are higher than the read voltage RL1 and are equal to or less than the read voltage RL2.

Note that in the first embodiment the number of memory cell transistors MT that are the target of counting is equal to or less than the number corresponding to one page data. In addition, for example, the width of state S15 is within a little more than 40 DAC. If the thinning-out mechanism thins out the read data of 16 KB including parities to 1/16, and outputs the thinned-out data, the state S15 includes approximately 500 bits. On the other hand, for example, by the read voltage RL2 being set at a voltage value of +8 DAC relative to the read voltage RL2, it is expected that the count value does not exceed 255 bits. In this manner, by the range of the read voltages RL1 and RL2 being appropriately set, it becomes possible to achieve the accuracy of the optimal read voltage and the high-speed on-chip tracking.

(5: Correspondence Relationship Between Count Result and Shift Value)

Figure 15:
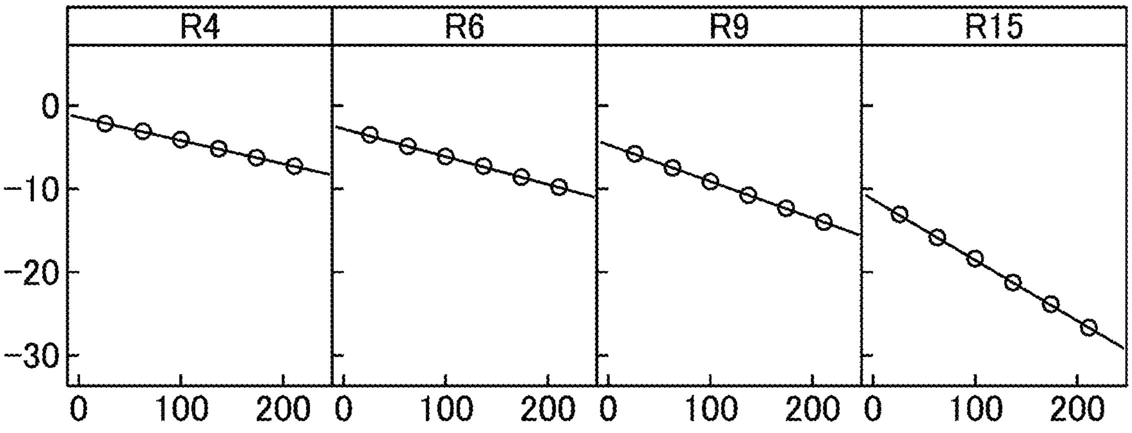
FIG. 15 is a graph illustrating an example of a correspondence relationship between a count value and a shift value in the memory device according to the first embodiment.

FIG. 15 is a graph illustrating an example of a correspondence relationship between a count value and a shift value in the memory device 2 according to the first embodiment. The vertical axis indicates an optimal shift value of read voltage. The horizontal axis indicates a count value in the process of step ST14 of FIG. 11. FIG. 15 illustrates a relationship between a count value and a shift value in each of the read voltages R4, R6, R9 and R15 used in the read operation of the middle page data. A graph illustrated in FIG. 15 is generated by applying stress to a certain middle page, and repeatedly executing the acquisition of the count value of the middle page and the search for the optimal shift value.

In the present example, in each of the read voltages R4, R6, R9 and R15, an approximate straight line between the count value and the shift value is obtained. A linear function expression corresponding to this approximate straight line is not limited to the middle page, and is similarly obtained in regard to the other pages. In this manner, the relationship between the count value obtained by the process of step S14 and the optimal shift value of the read voltage can be approximated by the linear function expression in regard to each of the read voltages. Accordingly, based on the count value, the memory device 2 can derive the optimal shift value for each of the read voltages.

In addition, the memory device 2 according to the first embodiment uses the shift value table 341 and the lookup table 342 in order to make simpler the process of deriving the optimal shift value of the read voltage, based on the count value. Hereinafter, specific examples of the shift value table 341 and the lookup table 342 are described.

(6: Specific Example of Shift Value Table 341)

FIG. 16 is a diagram illustrating a specific example of the shift value table 341 used in the on-chip tracking of the memory device 2 according to the first embodiment. FIG. 16 illustrates a correspondence relationship between a table number NTBL corresponding to the index value of the shift value table 341, and a shift value (DAC value) of the read voltage of each page. In the present example, a case is illustrated in which a common table number NTBL is used for each of the lower page data, middle page data, upper page data and top page data.

An example of the shift amount of each of the read voltages R5, R11 and R14 associated with the read operation of the lower page data is as follows.

Table number NTBL: shift amounts of read voltages R5, R11, and R14

| | |
|---|---|
| 1: | 0, −4, −7 |
| 2: | −2, −6, −10 |
| 3: | −3, −8, −12 |
| 4: | −4, −10, −15 |
| 5: | −5, −12, −17 |
| 6: | −6, −14, −20 |

An example of the shift amount of each of the read voltages R4, R6, R9 and R15 associated with the read operation of the middle page data is as follows.

Table number NTBL: shift amounts of read voltages R4, R6, R9 and R15

| | |
|---|---|
| 1: | −1, −2, −4, −9 |
| 2: | −2, −3, −5, −12 |
| 3: | −3, −5, −7, −15 |
| 4: | −4, −6, −9, −18 |
| 5: | −5, −7, −11, −21 |
| 6: | −6, −9, −12, −24 |

An example of the shift amount of each of the read voltages R2, R8, R10 and R12 associated with the read operation of the upper page data is as follows.

Table number NTBL: shift amounts of read voltages R2, R8, R10 and R12

| | |
|---|---|
| 1: | 0, −3, −5, −6 |
| 2: | 0, −4, −7, −8 |
| 3: | 0, −6, −9, −10 |
| 4: | −1, −8, −11, −13 |
| 5: | −1, −9, −13, −15 |
| 6: | −2, −11, −14, −17 |

An example of the shift amount of each of the read voltages R1, R3, R7 and R13 associated with the read operation of the top page data is as follows.

Table number NTBL: shift amounts of read voltages R1, R3, R7 and R13

| | |
|---|---|
| 1: | −5, 0, −3, −4 |
| 2: | −5, −1, −4, −7 |
| 3: | −5, −2, −5, −9 |
| 4: | −6, −3, −7, −11 |
| 5: | −6, −4, −8, −14 |
| 6: | −6, −5, −9, −16 |

By using the shift value table 341 as described above, the table selector 33 can acquire the optimal shift values of the read voltages corresponding to the table number NTBL. Note that the shift value table 341 may indicate the shift value of the read voltage, not by the DAC value but by the voltage value.

(7: Specific Example of Lookup Table 342)

FIG. 17 is a diagram illustrating a specific example of the lookup table 342 used in the on-chip tracking of the memory device 2 according to the first embodiment. FIG. 17 illustrates a correspondence relationship between the magnitude of a count value NC by the counter 32, and the table number NTBL of the shift value table 341.

An example of the table number NTBL associated with the magnitude of the count value NC is as follows.

Magnitude of count value NC: table number NTBL

| |
|---|
| NC < 28: 0 |
| 28 ≤ NC < 66: 1 |
| 66 ≤ NC < 104: 2 |
| 104 ≤ NC < 142: 3 |
| 142 ≤ NC < 180: 4 |
| 180 ≤ NC < 218: 5 |
| 218 ≤ NC: 6 |

By using the lookup table 342 as described above, the table selector 33 can select the table number NTBL corresponding to the count value NC. Note that the range of count values NC, to which the table number NTBL is allocated, may be divided into a smaller number than in the example illustrated in FIG. 17, or may be divided into a greater number than in the example illustrated in FIG. 17. The count value NC serving as a reference is appropriately set in accordance with the evaluation result as described with reference to FIG. 15.

<1-3> Advantageous Effect of First Embodiment

According to the first embodiment, the memory device 2 and the memory system MS, which have high reliability and can operate at high speed, can be provided. Hereinafter, the details of the advantageous effects of the first embodiment are described.

In the case of reading data from the NAND flash memory, optimal read voltages for all blocks BLK and all word lines WL are set based on test results in advance, in accordance with conditions at the time of product shipment. On the other hand, it is difficult to adapt to stresses, such as write/erase cycles, data retention, cross temperature and IR reflow, by only the read operation (normal read) using such read voltages. If these stresses are applied to the NAND flash memory, the number of error bits increases, and it becomes difficult to perform error correction by the ECC circuit 13 of the memory controller 1.

On the other hand, the Vth tracking can derive the optimal read voltage that is adaptive to the stresses. In addition, the influence of the stress upon the read voltage tends to become greater for a higher state. Furthermore, by finding the optimal read voltage for a high state, the memory device 2 can find read voltages for other states.

However, the Vth tracking acquires sample data from multiple-time read operations, estimates the optimal shift value of the read voltage, based on the acquired sample data, and executes a final data read operation. Thus, in a case where the Vth tracking is executed, there is concern about the influence upon the sequential read performance, and random read performance. Specifically, in order to achieve a high-speed operation, it is necessary to compatibly maintain the estimation accuracy of the shift value of the read voltage, and the stress tolerance, with a small number of times of sampling.

Thus, the memory system MS according to the first embodiment executes the on-chip tracking that can derive the optimal read voltage with a small number of times of sampling. Specifically, in order to extract memory cells that are a count target, the memory device 2 executes two-time single-level read (RL1 read and RL2 read). In addition, the memory device 2 executes the XOR operation of the results of the two-time single-level read, and appropriately thins out and counts the number of "1" bit data from the result of the XOR operation. Then, the memory device 2 selects the optimal shift value of the read voltage corresponding to the count result, from the shift value table 341.

Thereby, the memory device 2 can derive the optimal read voltage by two-time sampling, and can execute the read operation using the optimal read voltage. Accordingly, the first embodiment can provide the memory device 2 and the memory system MS, which have high reliability and can operate at high speed. In addition, the memory device 2 can estimate the read voltage on the low state side, based on the result of the on-chip tracking on the high state side. As a result, the memory device 2 according to the first embodiment can shorten the time needed for estimating the optimal read voltage, and can save power consumption.

Note that in the memory device 2 according to the first embodiment, in order to hold down the cost of hardware, a restriction may occur to the number of bits of the counter 32 to be mounted. In addition, if the number of bits to be counted at a time by the counter 32 increases, there is concern that the operation speed of the on-chip tracking lowers. In connection with this, in the memory device 2 according to the first embodiment, the number of bits to be counted by the counter 32 can be decreased by the execution of the XOR operation between the result of the RL1 read and the result of the RL2 read.

Furthermore, in the memory device 2 according to the first embodiment, the count target can be reduced by utilizing the thinning-out mechanism, and the restriction to the number of bits of the counter 32 can be cleared. Therefore, the memory device 2 according to the first embodiment has high reliability and can operate at high speed, and the manufacturing cost of the memory device 2 can be held down.

<1-4> Modifications of First Embodiment

The memory system MS according to the first embodiment can variously be modified.

For example, each of the RL1 read of step ST11 and the RL2 read of step ST12 is executed in the highest state (state S15 in the 4 bit/cell) in which a voltage transition amount is greatest in the data retention stress. However, in the write to the highest state, since there is no fear of erroneous write to a higher state, there is a case where high-speed write is executed by setting a greater ΔVPGM than in other states. The ΔVPGM corresponds to a difference of a voltage set value of a write pulse in each of program-verify loops in the write operation. Thus, there is a case where the highest state has a greater threshold voltage width after write than other states, and the highest state is not appropriate as the target of the RL1 read and RL2 read. In such a case, a state (for example, state S14 or state S13) lower than the highest state may be set as the target of the RL1 read and RL2 read.

Figure 18:
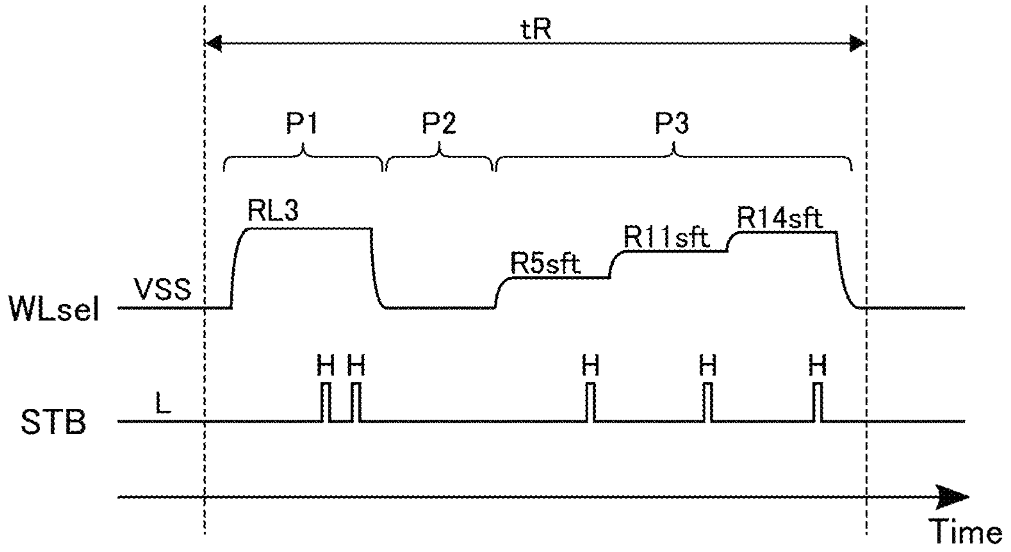
FIG. 18 is a schematic diagram illustrating an example of an operation waveform of the on-chip tracking of a memory device according to a first modification of the first embodiment.

In addition, the set of steps ST11 and ST12 may be executed by a read operation using one kind of read voltage. FIG. 18 is a schematic diagram illustrating an example of an operation waveform of the on-chip tracking of the memory device 2 according to a first modification of the first embodiment. FIG. 18 illustrates a voltage of a selected word line WLsel, and a control signal STB. Note that in the initial state before the start of the operation, the voltage of the selected word line WLsel is VSS, and the control signal STB is at low level ("L"). Hereinafter, a case is described in which on-chip tracking is executed for a lower page as a target.

As illustrated in FIG. 18, the period in which the on-chip tracking is executed in the first modification of the first embodiment includes three periods P1, P2 and P3, as in the first embodiment. The operations in the periods P2 and P3 in the first modification of the first embodiment are similar to those in the first embodiment.

In the period P1 of the first modification of the first embodiment, the sequencer 24 applies a read pass voltage VREAD to an unselected word line WL (not illustrated). In addition, the sequencer 24 applies a read voltage RL3 to a selected word line WLsel. The read voltage RL3 is, for example, the same voltage as the read voltage RL2. Further, the sequencer 24 asserts the control signal STB twice at different timings, while the voltage RL3 is being applied to the selected word line WLsel. Then, the result of the two-time read is stored in any one of the latch circuits of each sense amplifier unit SAU. In this operation, the same result as in the case where both the RL1 read in step ST11 and the RL2 read in step ST12 in FIG. 11 are executed.

For example, if the read voltage RL3 is applied to the selected word line WLsel, the voltage of the selected word line WLsel rises by CR charge. Then, the difference in timing when data is taken in the sense amplifier unit SAU is converted to a voltage difference between the read voltages RL1 and RL2. Thereby, the memory device 2 in the first modification of the first embodiment can obtain a similar read result to the read operation in the period P1 of the first embodiment, by the read operation using one kind of read voltage RL3. Note that such a read operation can also be implemented by twice asserting the control signal STB at timings at which the discharge time of the sense node included in the sense amplifier section SA is different, after the charging in the selected word line WLsel is completed.

The above-described operation can similarly be executed, also in the case where on-chip tracking in which another page is selected is executed. Thereby, like the first embodiment, the memory device 2 according to the first modification of the first embodiment can execute the read operation using the optimal shift value of the read voltage by the on-chip tracking, and can improve the reliability of the memory device 2. Furthermore, the memory device 2 according to the first modification of the first embodiment can make shorter the time needed for sampling than in the first embodiment.

Note that, like the first embodiment, the memory device 2 according to the first modification of the first embodiment may find the shift value of the read voltage by calculation, for example, by using a linear function in which the count value is set as a variable, instead of the lookup table 342. In addition, in a case where the memory device 2, to which the modification of the first embodiment is applied, implements similar soft bit read to the above-described read operation, the above-described read operation may be implemented by using a circuit used in the soft bit read as such.

Figure 19:
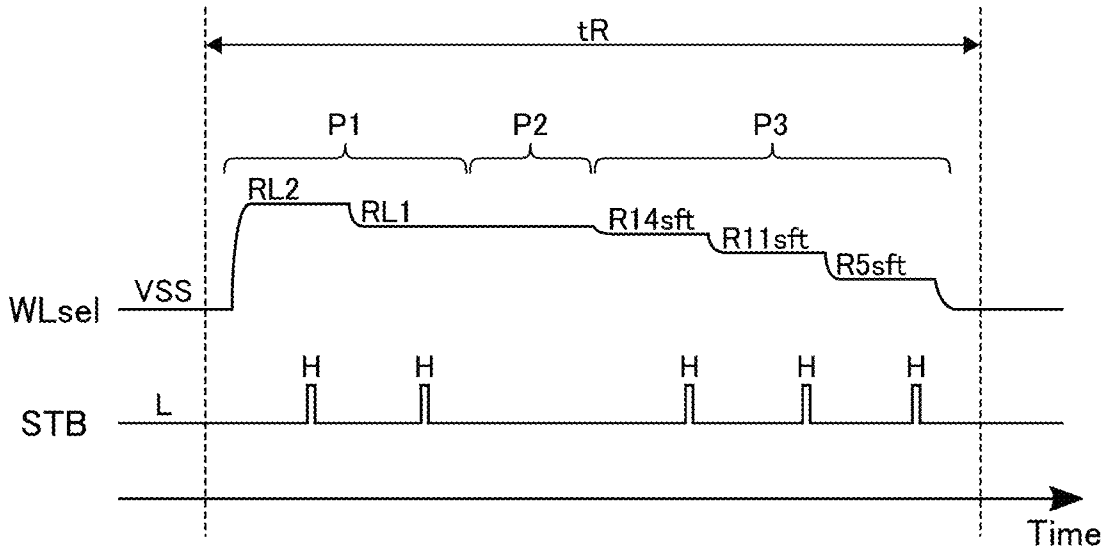
FIG. 19 is a schematic diagram illustrating an example of an operation waveform of the on-chip tracking of a memory device according to a second modification of the first embodiment.

Note that in each of the periods P1 and P3 of the on-chip tracking, the order of application of read voltages may be an order beginning from a higher voltage. In addition, the sequencer 24 may keep, in the period P2, the read voltage applied last in the period P1, and may transition, in the period P3, this read voltage directly to the optimal read voltage. FIG. 19 is a schematic diagram illustrating an example of an operation waveform of the on-chip tracking of the memory device 2 according to a second modification of the first embodiment. FIG. 19 illustrates a voltage of a selected word line WLsel, and a control signal STB. Note that in the initial state before the start of the operation, the voltage of the selected word line WLsel is VSS, and the control signal STB is at low level ("L"). Hereinafter, a case is described in which on-chip tracking is executed for a lower page as a target.

As illustrated in FIG. 19, the period in which the on-chip tracking is executed in the second modification of the first embodiment includes three periods P1, P2 and P3, as in the first embodiment. The sequencer 24 applies, in the period P1, read voltages RL2 and RL1 in the named order to the selected word line WLsel, and keeps, in the period P2, the voltage of the selected word line WLsel at the read voltage RL1. Then, in the period P3, the sequencer 24 transitions the voltage of the selected word line WLsel from the read voltage RL1 to the optimal read voltage R14sft, and then applies the optimal read voltages R11sft and R5sft in the named order to the selected word line WLsel. In the second modification of the first embodiment, in each of the periods in which the read voltages are applied, the control signal STB is asserted and data is read out, as in the first embodiment.

The above-described operation can similarly be executed in the case where the on-chip tracking, in which another page is selected, is executed. Thereby, in the on-chip tracking of the memory device 2 according to the second modification of the first embodiment, the same advantageous effects as in the first embodiment can be obtained. Furthermore, in the memory device 2 according to the second modification of the first embodiment, the time needed for voltage control of the selected word line WLsel can be made shorter than in the first embodiment, and the time of the on-chip tracking can be made shorter. Note that the second modification of the first embodiment may be combined with the first modification of the first embodiment. Specifically, in the period P1 of the on-chip tracking of the second modification of the first embodiment, the read operation using one kind of read voltage may be executed as in the first modification of the first embodiment.

<2> Second Embodiment

A second embodiment relates to a memory system MS configured to determine an optimal shift value of a read voltage, based on the result of counting of the number of memory cell transistors MT in a threshold region different from the threshold region in the first embodiment. Hereinafter, the details of the memory system MS according to the second embodiment are described mainly on differences from the first embodiment.

<2-1> Configuration

Figure 20:
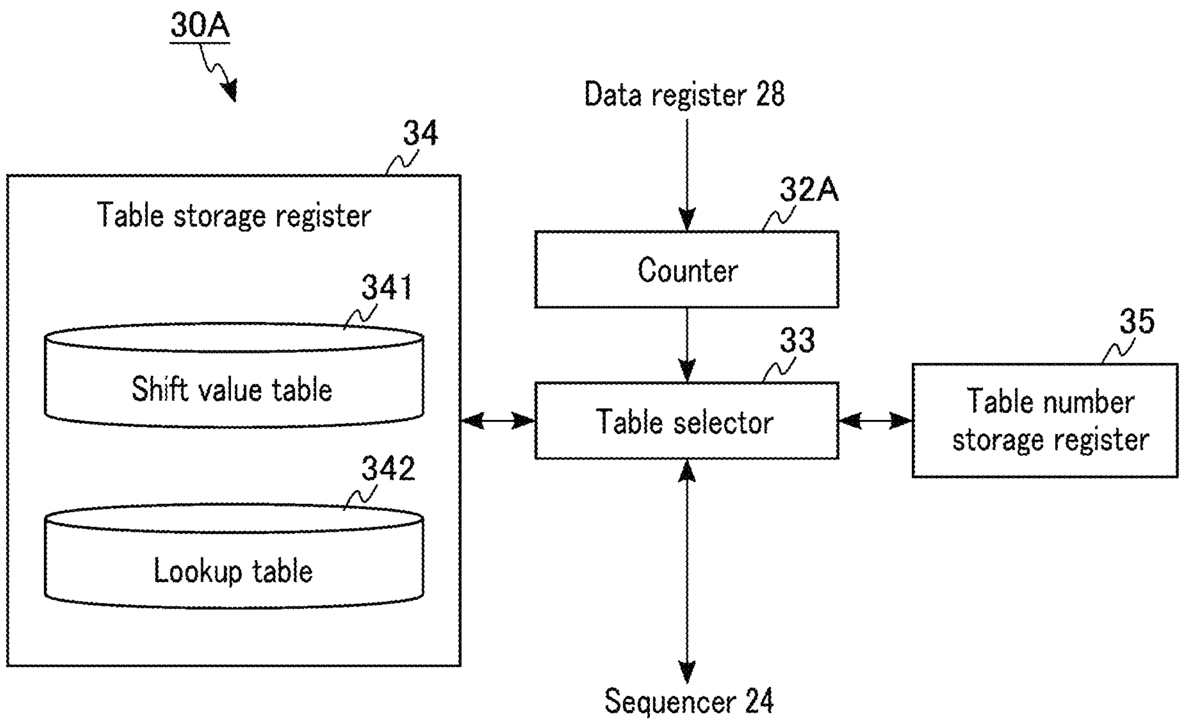
FIG. 20 is a block diagram illustrating an example of a configuration of a voltage regulator included in a memory device according to a second embodiment.

FIG. 20 is a block diagram illustrating an example of a configuration of a voltage regulator 30A included in a memory device 2 according to the second embodiment. As illustrated in FIG. 20, the voltage regulator 30A includes, for example, a counter 32A, a table selector 33, a table storage register 34, and a table number storage register 35. Specifically, compared to the voltage regulator 30 of the first embodiment, the voltage regulator 30A is configured such that the arithmetic circuit 31 is omitted and the counter 32 is replaced with the counter 32A.

The counter 32A receives data corresponding to the read result from the data register 28. In addition, the counter 32A counts the number of "0" bit data included in the received data. Then, the counter 32A outputs the count result to the table selector 33. The counter 32A, for example, is configured to be capable of counting a larger number than the counter 32 of the first embodiment. The counter 32 is, for example, a 9-bit counter. In addition, the counter 32A includes a thinning-out mechanism that can execute a thinning-out process of the data received from the data register 28. The configuration of the thinning-out mechanism is the same as in the first embodiment.

Note that each of the shift value table 341 and the lookup table 342 stored in the table storage register 34 in the second embodiment stores information in which the count value of "0" bit data by the counter 32A and the optimal shift value of the read voltage are associated. In the voltage regulator 30A, the thinning-out mechanism may be omitted from the counter 32A of the voltage regulator 30A. In this case, the thinning-out process is executed by the data transferred from the data register 28 to the counter 32A being thinned out, without using the counter 32A. Besides, the thinning-out process may be executed at a time of read. In a case where the thinning-out process is executed at a time of read, the read time can be shortened since the number of read data decreases. Aside from this, it suffices that the memory device 2 according to the second embodiment is configured to be capable of executing the thinning-out process. The other configuration of the memory system MS according to the second embodiment is similar to the memory system MS according to the first embodiment.

<2-2> Operation

Hereinafter, the operation of the memory system MS according to the second embodiment is described.

(1: Process Flow of On-Chip Tracking)

Figure 21:
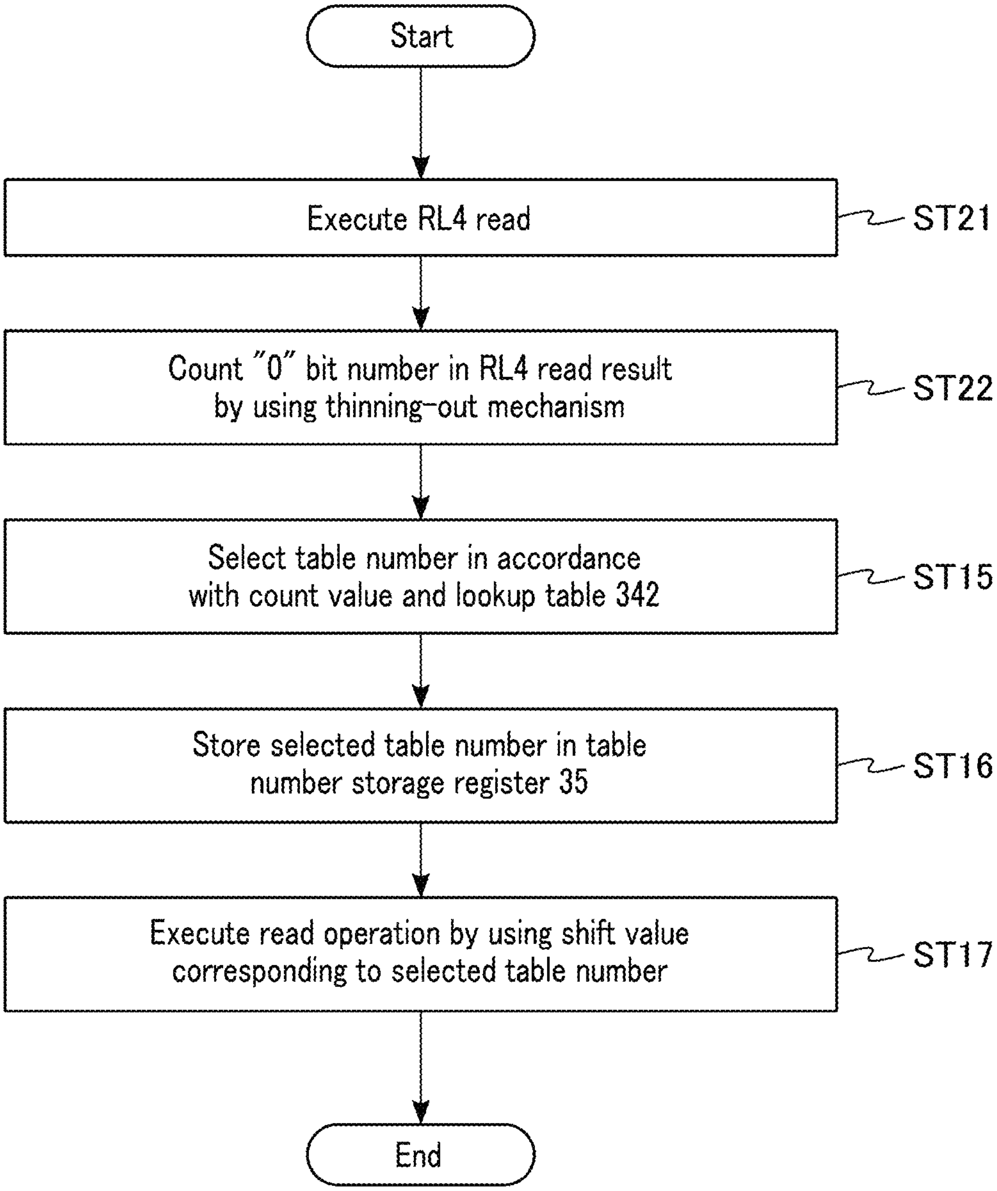
FIG. 21 is a flowchart illustrating an example of a process flow of the on-chip tracking of the memory device according to the second embodiment.

FIG. 21 is a flowchart illustrating an example of a process flow of on-chip tracking of the memory device according to the second embodiment. The memory device 2 according to the second embodiment starts a series of processes of FIG. 21, for example, upon receiving the address of a read-target page and an instruction for execution of on-chip tracking from the memory controller 1.

To start with, the memory device 2 executes RL4 read (step ST21). The RL4 read is a read operation using a read voltage RL4. The read voltage RL4 is set to overlap, for example, a highest state (for example, state S15).

Next, the memory device 2 counts a "0" bit number (the number of "0" bit data) in the result of the RL4 read utilizing the thinning-out mechanism (step ST22). The thinning-out mechanism adjusts a thinning-out amount, for example, so as to set 511 bits at maximum. Then, the counter 32A counts the "0" bit number included in the thinned-out result of the RL4 read. Note that in the process of step ST22, the counter 32A is controlled not to cause an overflow. For example, in a case where the counter 32A is a 9-bit counter, the count value is stopped at a 511 count.

Subsequently, the memory device 2 selects, like the first embodiment, a table number in accordance with the count value and the lookup table 342 (step ST15).

Next, the memory device 2 stores, like the first embodiment, the selected table number in the table number storage register 35 (step ST16).

Subsequently, the memory device 2 executes a read operation by using a shift value corresponding to the selected table number (step ST17).

In the above description, the case was described in which the shift value table 341 and the lookup table 342 are used in order to find the optimal shift value of the read voltage, but the embodiment is not limited to this. The memory device 2 according to the second embodiment may be configured to find the shift value of the read voltage by calculating a linear expression or the like, with the count value of step ST22 being set as a variable.

(2: Operation Waveform of On-Chip Tracking)

Figure 22:
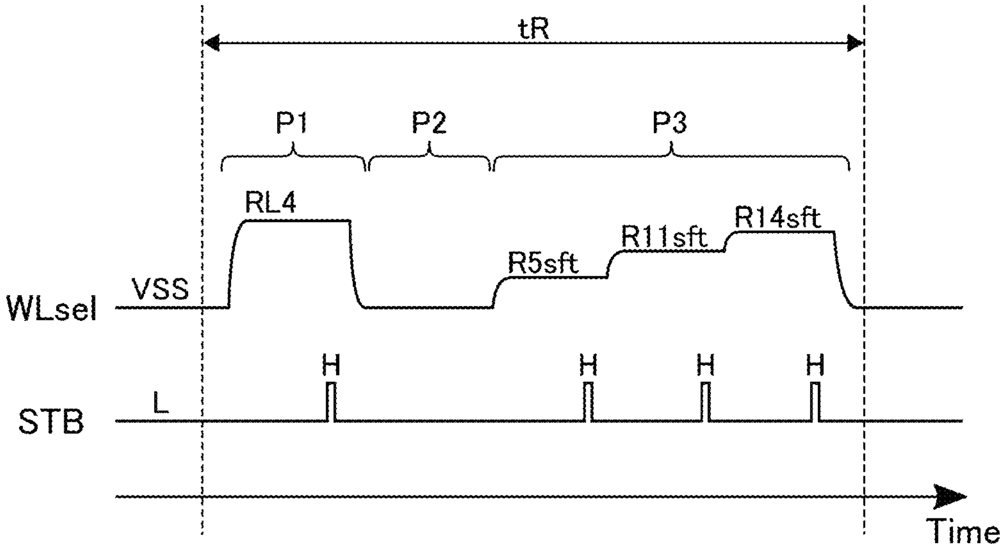
FIG. 22 is a schematic diagram illustrating an example of an operation waveform of the on-chip tracking of the memory device according to the second embodiment.

FIG. 22 is a schematic diagram illustrating an example of an operation waveform of the on-chip tracking of the memory device 2 according to the second embodiment. FIG. 22 illustrates a voltage of a selected word line WLsel, and a control signal STB. Note that in the initial state before the start of the operation, the voltage of the selected word line WLsel is VSS, and the control signal STB is at low level ("L"). Hereinafter, a case is described in which on-chip tracking is executed for a lower page as a target.

As illustrated in FIG. 22, the period in which the on-chip tracking is executed in the second embodiment includes three periods P1, P2 and P3, as in the first embodiment.

In the period P1 of the second embodiment, the sequencer 24 applies a read pass voltage VREAD to an unselected word line WL (not illustrated). In addition, the sequencer 24 applies a read voltage RL4 to a selected word line WLsel. The read voltage RL4 is set to overlap, for example, a highest state (for example, state S15). Further, the sequencer 24 asserts the control signal STB while the read voltage RL4 is being applied. Then, the read result is stored in any one of the latch circuits of each sense amplifier unit SAU (step ST21 in FIG. 21).

In the period P2 of the second embodiment, the sequencer 24 controls the voltage regulator 30A, and selects the optimal shift value of the read voltage, based on the result of the read operation in the period P1 (step ST22, ST15 and ST16 in FIG. 21).

In the period P3 of the second embodiment, the sequencer 24 applies the read pass voltage VREAD to the unselected word line WL (not illustrated). In addition, the sequencer 24 successively applies optimal read voltages R5sft, R11sft and R14sft to the selected word line WLsel, and asserts the control signal STB in each of periods in which the optimal read voltages R5sft, R11sft and R14sft are applied. In addition, the sequencer 24 determines the lower page data, based on the read results using the optimal read voltages R5sft, R11sft and R14sft. Then, the sequencer 24 stores the determined data in the data register 28.

The above-described operation can similarly be executed in a case where on-chip tracking in which another page is selected is executed. Note that the memory device 2 according to the second embodiment may find the shift value of the read voltage by calculation, for example, by using a linear function in which the count value is set as a variable, instead of the lookup table 342. As described in the second modification of the first embodiment, in each of the periods P1 and P3 of the on-chip tracking of the second embodiment, the order of application of read voltages may be an order beginning from a higher voltage. In addition, the sequencer 24 may keep, in the period P2, the read voltage applied last in the period P1, and may transition, in the period P3, this read voltage directly to the optimal read voltage. Thereby, like the second modification of the first embodiment, the memory device 2 according to the second embodiment can shorten the time of the on-chip tracking.

(3: Outline of Count Process)

Figure 23:
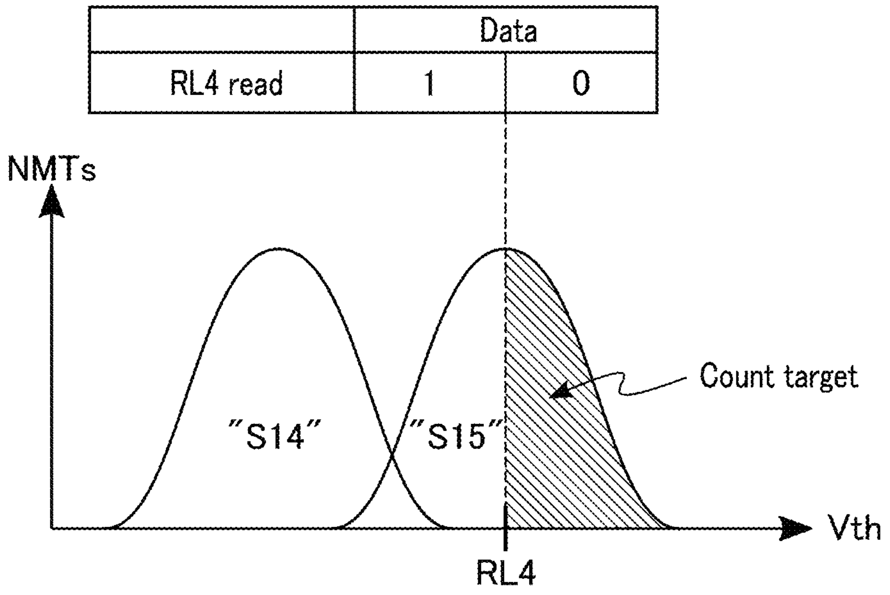
FIG. 23 is a schematic diagram illustrating an outline of a count target in the on-chip tracking of the memory device according to the second embodiment.

FIG. 23 is a schematic diagram illustrating an outline of a count target in the on-chip tracking of the memory device 2 according to the second embodiment. FIG. 23 illustrates a correspondence relationship between the state S14 and state S15 in the threshold voltage distribution of memory cell transistors MT, and the result of RL4 read. As illustrated in FIG. 23, in the present example, the read voltage RL4 is set to overlap state S15 that is the highest state.

In the RL4 read, "1" bit data is read from the memory cell transistors MT having threshold voltages that are equal to or less than the read voltage RL4, and "0" bit data is read from the memory cell transistors MT having threshold voltages that are higher than the read voltage RL4. Thus, the count target in the process of step ST22 of FIG. 21 corresponds to the number of the memory cell transistors MT having threshold voltages that are higher than the read voltage RL4 (the number of "0" bit data).

Note that the number of memory cell transistors MT that are the target of counting in the second embodiment is equal to or less than a number corresponding to one page data. There is a case where the highest state has a larger threshold voltage width after write than other states, and is not suitable as the target of the RL4 read. In such a case, a state (for example, state S14 or state S13) lower than the highest state may be set as the target of the RL4 read. The other operation of the memory system MS according to the second embodiment is similar to the memory system MS according to the first embodiment.

<2-3> Advantageous Effects of Second Embodiment

As described above, the memory device 2 according to the second embodiment counts the "0" bit data from the result of one-time sampling, and derives the optimal read voltage, based on the shift value table 341 and the lookup table 342. Thereby, the memory device 2 according to the second embodiment can execute the read operation using the optimal read voltage. Therefore, like the first embodiment, the second embodiment can provide the memory device 2 and the memory system MS, which have high reliability and can operate at high speed.

<3> Third Embodiment

A third embodiment relates to a memory system MS that can execute a read operation by using the result of the on-chip tracking described in the first embodiment or the second embodiment. Hereinafter, the details of the memory system MS according to the third embodiment will be described mainly on differences from the first and second embodiments.

<3-1> Configuration

The configuration of the memory system MS according to the third embodiment is similar to that of the memory system MS according to the first embodiment or second embodiment.

<3-2> Operation

Hereinafter, the operation of the memory system MS according to the third embodiment is described.

(1: Process Flow of On-Chip Tracking)

Figure 24:
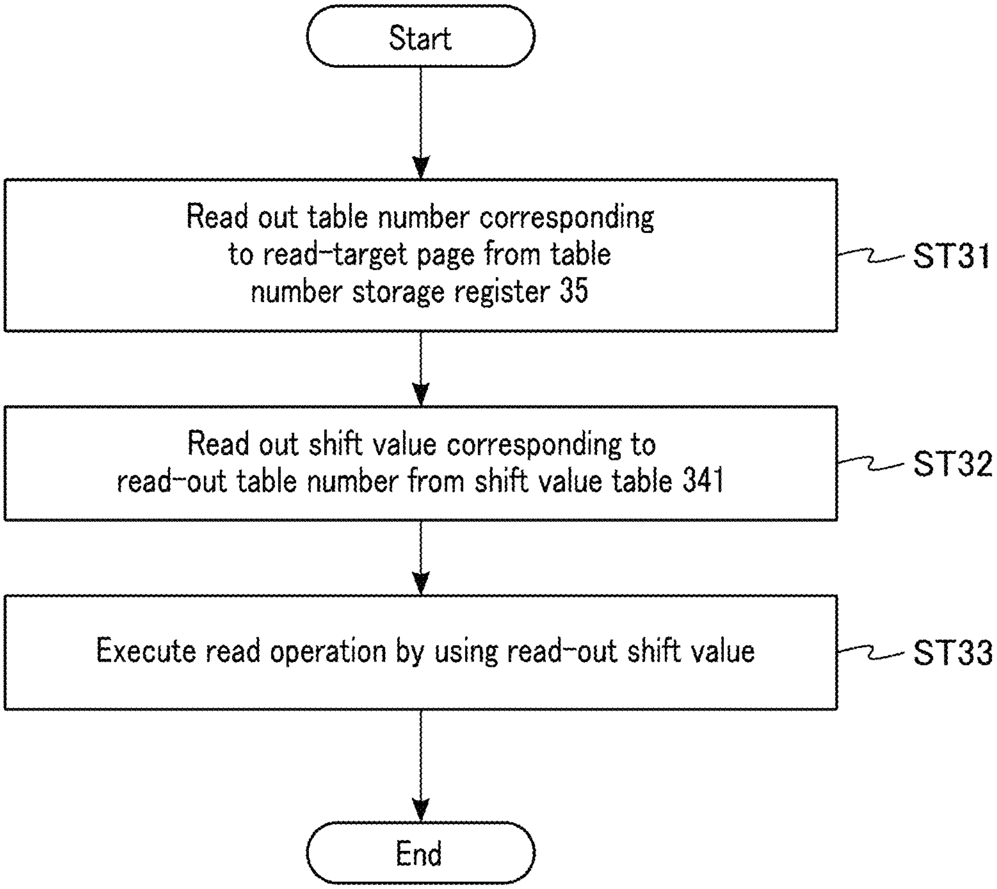
FIG. 24 is a flowchart illustrating an example of a process flow of the on-chip tracking of a memory device according to a third embodiment.

FIG. 24 is a flowchart illustrating an example of a process flow of the on-chip tracking of the memory device 2 according to the third embodiment. The memory device 2 according to the third embodiment starts a series of processes of FIG. 24, for example, upon receiving the address of a read-target page and an instruction for execution of a read operation using a result of on-chip tracking from the memory controller 1.

To start with, the memory device 2 reads out the table number associated with the read-target page from the table number storage register 35 (step ST31). The table number that is read out in the process of step ST31 is a table number acquired in regard to another page of the same word line WL, a table number acquired in regard to the same block BLK, or the like.

Next, the memory device 2 reads out, from the shift value table 341, a shift value corresponding to the table number read out from the table number storage register 35 (step ST32).

Subsequently, the memory device 2 executes a read operation by using the read-out shift value (step ST33). Specifically, the sequencer 24 derives an optimal read voltage to be used, based on the shift value corresponding to the selected table number, and executes the read operation by using the optimal read voltage.

In the above description, the case was described in which the shift value table 341 and the lookup table 342 are used in order to find the optimal shift value of the read voltage, but the embodiment is not limited to this. The memory device 2 according to the third embodiment may be configured to find the shift value of the read voltage by calculating a linear expression or the like, with the count value being set as a variable, in the case where the table number storage register 35 stores the count value in place of the table number. In this manner, the table number storage register 35 may be configured to store the count value acquired in step ST14 or ST22.

(2: Command Sequence)

Figure 25:
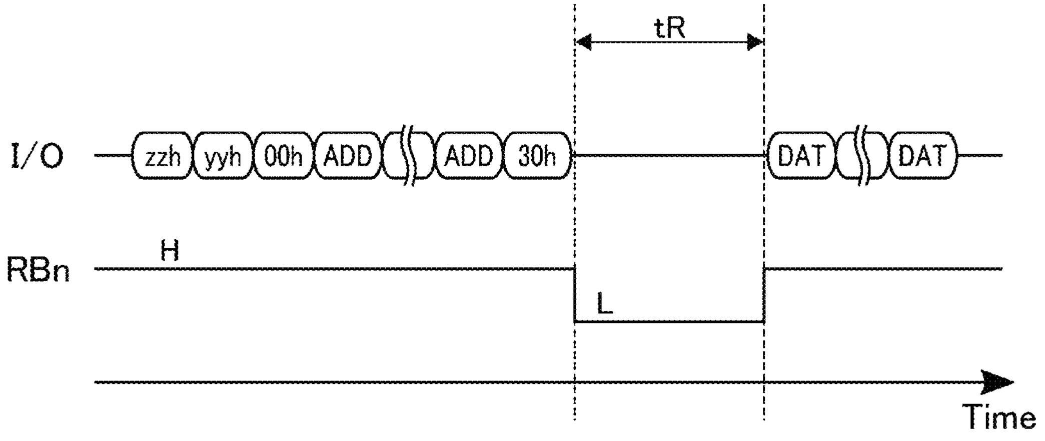
FIG. 25 is a schematic diagram illustrating an example of a command sequence of a read operation using a result of the on-chip tracking in the memory device according to the third embodiment.

FIG. 25 is a schematic diagram illustrating an example of a command sequence of a read operation using a result of the on-chip tracking in the memory device 2 according to the third embodiment. FIG. 25 illustrates the input/output signal I/O and the ready/busy signal RBn in a case where the read operation using the result of on-chip tracking is executed. Note that, before the start of the operation, the ready/busy signal RBn is at "H" level (high level: ready state).

As illustrated in FIG. 25, the memory controller 1 first sends to the memory device 2 a command "zzh", a command "yyh", a command "00h", an address "ADD" and a command "30h" in the named order. The command "zzh" is a command that instructs the use of the result of the on-chip tracking.

If the command "30h" is stored in the register circuit 23, the sequencer 24 transitions the memory device 2 from a ready state (RBn="H") to a busy state (RBn="L" (low level: busy state), thus starting the read operation using the result of the on-chip tracking. In FIG. 25, a period in which the read operation using the result of the on-chip tracking is executed is indicated by tR.

If the read operation using the result of the on-chip tracking is completed, the sequencer 24 transitions the memory device 2 from the busy state to the ready state. Upon detecting the end of the read operation, based on the change of the ready/busy signal RBn, the memory controller 1 causes the memory device 2 to successively output the read result (data DAT), for example, by toggling the control signal REn.

(3: Waveform of Read Operation)

Figure 26:
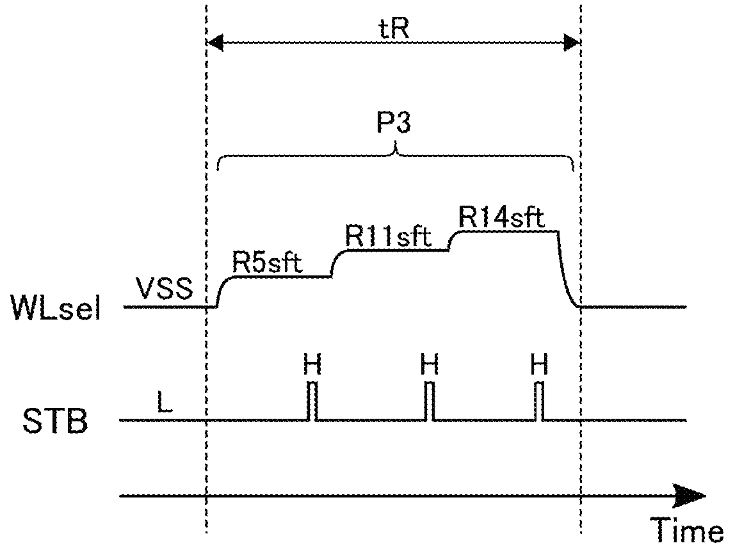
FIG. 26 is a schematic diagram illustrating an example of an operation waveform in a read operation using a result of the on-chip tracking in the memory device according to the third embodiment.

FIG. 26 is a schematic diagram illustrating an example of an operation waveform in the read operation using the result of the on-chip tracking of the memory device according to the third embodiment. FIG. 26 illustrates a voltage of a selected word line WLsel, and a control signal STB. Note that in the initial state before the start of the operation, the voltage of the selected word line WLsel is VSS, and the control signal STB is at low level ("L"). Hereinafter, a case is described in which on-chip tracking is executed for a lower page as a target.

As illustrated in FIG. 26, the read operation using the result of the on-chip tracking includes only a period P3. Specifically, in the period P3 of the third embodiment, the sequencer 24 acquires the shift values of the read voltage obtained from the shift table 341, based on the index number of the shift value table 341 stored in the table number storage register 35 (steps ST31 and ST32 of FIG. 24). In addition, the sequencer 24 sets optimal read voltages R5sft, R11sft and R14sft to which the acquired shift values of the read voltage are applied, and executes the read operation, as in the period P3 illustrated in FIG. 13 in the first embodiment (step ST33 of FIG. 24).

The above-described operation can similarly be executed in a case where on-chip tracking in which another page is selected is executed. The other operation of the memory system MS according to the third embodiment is similar to the memory system MS according to the first embodiment or second embodiment.

<3-3> Advantageous Effects of Third Embodiment

The memory device 2 according to the third embodiment derives the optimal read voltage of the read-target page by utilizing the table number that has already been acquired in regard to an associated page or the like, based on the instruction from the memory controller 1. Thereby, the memory device 2 according to the third embodiment can execute the read operation using the optimal read voltage, for example, without executing the process in the periods P1 and P2 illustrated in FIG. 13. Therefore, the third embodiment, like the first embodiment or second embodiment, can provide the memory device 2 and memory system MS, which have high reliability and can operate at high speed.

<4> Others

In the memory controller 1 in the above embodiments, a micro processing unit (MPU) may be used instead of the CPU 12. In addition, each of the processes described in the above embodiments can be executed by a dedicated hardware circuit, a processor that executes a program (firmware), or a combination thereof.

The command sequences exemplified in the above embodiments are merely examples. The read-target page may be indicated by the address ADD. Freely selected numerals can be applied to "xxh", "yyh" and "zzh". The flowcharts used for the description in the above embodiments are merely examples. Other processes may be added to the processes illustrated in the flowcharts. In the present specification, the term "couple" refers to electrical coupling, and does not exclude, for example, interposition of another element therebetween. "Electrically coupled" may be via an insulator if an operation is possible in the same manner as electrical coupling. The word line WL, the select gate lines SGD and SGS, and the like may be simply referred to as "interconnect".

The high-level voltage is a voltage at which the N-type transistor, to the gate of which the high-level voltage is applied, is turned on. The low-level voltage is a voltage at which the N-type transistor, to the gate of which the low-level voltage is applied, is turned off. In the present specification, applying a voltage to the word line WL corresponds to the driver circuit 26 applying a voltage to the word line WL via the row decoder module 27. Similar to the word line WL, the applying of the voltage to the other interconnects also corresponds to the applying of the voltage by the driver circuit 26 via the row decoder module 27. The voltage of each interconnect may be estimated based on the voltage of the signal line connecting the driver circuit 26 and the row decoder module 27.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device comprising:

a plurality of memory cells each configured to store multiple-bit data according to which of a plurality of states having different threshold voltages each of the memory cells is included in;

a word line connected to the memory cells; and a controller configured to count a number of memory cells having threshold voltages on a higher state side among the states, and to execute a read operation for the memory cells as a target, by using a read voltage that is shifted based on a result of the counting.

2. The memory device of claim 1, wherein a set of the memory cells connected to the word line stores multiple-page data, and a number of memory cells that are a target of the counting is equal to or less than a number corresponding to one page data.

3. The memory device of claim 1, wherein the controller is further configured to execute a thinning-out process of the number of the memory cells having the threshold voltages on the higher state side, before executing the counting.

4. The memory device of claim 3, further comprising a counter used for the counting, wherein the controller is further configured to execute control to prevent an overflow of the counter at a time of the counting.

5. The memory device of claim 2, wherein the controller is further configured to determine, based on the result of the counting, shift values of all read voltages used in the read operations of the multiple-page data.

6. The memory device of claim 1, wherein a result of an exclusive OR operation of results of two times of sampling is used as the number of the memory cells having the threshold voltages on the higher state side.

7. The memory device of claim 6, wherein the memory cells having the threshold voltages on the higher state side are included in a highest state among the states, and the result of the two times of sampling is acquired by a read operation using a read voltage that is set to overlap the highest state.

8. The memory device of claim 6, wherein the result of the two times of sampling is acquired by a read operation using two mutually different kinds of read voltages.

9. The memory device of claim 6, wherein the result of the two times of sampling is acquired by a read operation in which data is determined twice at different timings by using one kind of read voltage.

10. The memory device of claim 1, wherein the number of the memory cells having the threshold voltages on the higher state side is based on a result of one-time sampling.

11. The memory device of claim 10, wherein the memory cells having the threshold voltages on the higher state side are included in a highest state among the states, and the result of the one-time sampling is acquired by a read operation using a read voltage that is set to overlap the highest state.

12. The memory device of claim 1, further comprising a first storage circuit configured to store a table in which a magnitude of the result of the counting and a shift amount of the read voltage are associated, wherein the controller is configured to determine the read voltage that is regulated, based on the table.

13. The memory device of claim 1, wherein the controller is further configured to determine the read voltage that is regulated, by using a relational expression between a magnitude of the result of the counting and a shift amount of the read voltage.

14. The memory device of claim 1, wherein the controller is further configured to execute, based on reception of a first command and an address, counting of the number of memory cells having the threshold voltages on the higher state side, and execution of the read operation for the memory cells as the target by using the read voltage that is shifted based on the result of the counting.

15. A memory system comprising:

the memory device of claim 14; and a memory controller configured to issue the first command and to send the first command to the memory device.

16. The memory device of claim 12, further comprising a second storage circuit configured to store an index number of the table corresponding to the result of the counting.

17. The memory device of claim 16, wherein the controller is further configured to execute, in a case where the second storage circuit stores the index number, a read operation of second page data that is different from the first page data used in acquiring the index number, by using a read voltage that is shifted based on information of a shift value corresponding to the index number.

18. The memory device of claim 17, wherein a set of the memory cells connected to the word line stores multiple-page data including the first page data and the second page data.

19. The memory device of claim 17, wherein the controller is further configured to acquire, based on reception of a second command and an address, the index number from the second storage circuit, and to execute a read operation of the second page data.

20. A memory system comprising:

the memory device of claim 19; and a memory controller configured to issue the second command and to send the second command to the memory device.

* * * * *